United States Patent
Shi et al.

(10) Patent No.: US 10,361,728 B2
(45) Date of Patent: Jul. 23, 2019

(54) MULTIPLE-SYMBOL COMBINATION BASED DECODING FOR GENERAL POLAR CODES

(71) Applicants: Wuxian Shi, Kanata (CA); Ran Zhang, Kanata (CA); Nan Cheng, Kanata (CA); Yiqun Ge, Kanata (CA)

(72) Inventors: Wuxian Shi, Kanata (CA); Ran Zhang, Kanata (CA); Nan Cheng, Kanata (CA); Yiqun Ge, Kanata (CA)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 224 days.

(21) Appl. No.: 15/611,281

(22) Filed: Jun. 1, 2017

(65) Prior Publication Data

US 2017/0366204 A1 Dec. 21, 2017

Related U.S. Application Data

(60) Provisional application No. 62/351,546, filed on Jun. 17, 2016.

(51) Int. Cl.
*H03M 13/00* (2006.01)
*H03M 13/13* (2006.01)
*H03M 13/37* (2006.01)
*H04L 25/06* (2006.01)

(52) U.S. Cl.
CPC ....... *H03M 13/616* (2013.01); *H03M 13/134* (2013.01); *H03M 13/3769* (2013.01); *H04L 25/061* (2013.01)

(58) Field of Classification Search
CPC .................................................. H03M 13/616
See application file for complete search history.

(56) References Cited

U.S. PATENT DOCUMENTS

| 2012/0054576 | A1* | 3/2012 | Gross | H03M 13/1117 |
| | | | | 714/752 |
| 2013/0117344 | A1 | 5/2013 | Gross et al. | |
| 2015/0194987 | A1* | 7/2015 | Li | H04L 1/0057 |
| | | | | 714/752 |
| 2015/0333775 | A1 | 11/2015 | Korb et al. | |

(Continued)

FOREIGN PATENT DOCUMENTS

CN 102111241 A 6/2011

OTHER PUBLICATIONS

Ramtin Pedarsani, Polar Codes: Construction and Performance Analysis, Jun. 2011 (48 pages).
Ido Tal, Alexander Vardy, List of Decoding of Polar Codes, Proceedings of the 2011 IEEE International Symposium on Information Theory, May 31, 2012 (11 pages).

(Continued)

*Primary Examiner* — Joseph D Torres

(57) ABSTRACT

The present disclosure relates to multiple-symbol combination based decoding for general polar codes. Multiple-symbol combination based decoding of a received word that is based on a codeword involves determining whether all nodes at an intermediate stage of the multiple-symbol combination based decoding, which provide their outputs as inputs to a subset of nodes at a next stage of the multi-symbol combination based decoding, are associated with trust symbols in the received word that have a higher reliability of being successfully decoded than doubt symbols in the received word. A hard decision is performed in response to a positive determination.

15 Claims, 14 Drawing Sheets

(56) References Cited

U.S. PATENT DOCUMENTS

2016/0013810 A1* 1/2016 Gross .................. H03M 13/09
                                                      714/776
2017/0126354 A1* 5/2017 Marsland ............. H04L 1/0041
2017/0331577 A1* 11/2017 Parkvall ............... H04J 11/0079
2017/0331670 A1* 11/2017 Parkvall ............ H04W 52/0274

OTHER PUBLICATIONS

Jincheng Dia, Kai Niu, Zhongwei Si, Chao Dong, Jiaru Ling, Does Gaussian Approximation Work Well for The Long-Length Polar Code Construction?, Mar. 16, 2017 (12 Pages).

Kai Niu, Kai Chen, CRC-Aided Decoding of Polar Codes, IEEE Communications Letters, vol. 16, No. 10, Oct. 2012 (4 pages).

Edral Arikan, Channel polarization: A method for constructing capacity-achieving codes for symmetric binary-input memoryless channels, IEEE Trans. Inf. Theory, vol. 55, No. 7, Jul. 20, 2009 (23 pages).

Nioam Presman, Ofer Shapira, Simon Litsyn, Polar Codes with Mixed-Kernels, 2011 IEEE Symposium on Information Theory (ISIT) Proceedings, 2011, (29 pages).

Nioam Presman, Simon Litsyn, Recursive Descriptions of Polar Codes, Jun. 18, 2015 (60 pages).

Ryuhei Mori, Toshiyuki Tanaka, Channel Polarization on q-ary Discrete Memoryless Channels by Arbitrary Kernels, 2010 IEEE Symposium on Information Theory (ISIT) Proceedings, Jul. 21, 2010 (5 pages).

Ryuhei Mori, Toshiyuki Tanaka, Non-Binary Polar Codes using Reed-Solomon Codes and Algebraic Geometry Codes, 2010 IEEE Information Theory Workshop, Jul. 21, 2010 (5 pages).

* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \leftarrow 102$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$
$\leftarrow 104$

FIG. 1

MULTIPLE-SYMBOL COMBINATION BASED DECODING FOR GENERAL POLAR CODES

CROSS-REFERENCE TO RELATED APPLICATIONS

The present application claims the benefit of U.S. Provisional Application No. 62/351,546, entitled "Multiple-Symbol Combination Based Decoding for General Polar Codes", filed on Jun. 17, 2016, incorporated in its entirety herein by reference.

FIELD

The present disclosure relates to generally to communications and, in particular, to symbol decoding for general polar codes.

BACKGROUND

Polar codes are proposed as new channel codes for wireless communications, and have been selected for uplink and downlink eMBB control channel coding for the new $5^{th}$ Generation (5G) air interface, also known as the 5G New Radio (NR). These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation (SC) decoding and its extension SC List (SCL) decoding, including Cyclic Redundancy Check (CRC)-aided list decoding, are effective and efficient options for decoding polar coded information.

Based on channel polarization, Arikan designed a channel code that is proven to achieve the capacity of symmetric channels. Polarization refers to a coding property that, as code length increases to infinity, bit-channels also referred to as sub-channels polarize and their capacities approach either zero (completely noisy channel) or one (completely perfect channel). In other words, bits encoded in high capacity sub-channels will experience a synthesized channel with equivalently high Signal-to-Noise Ratio (SNR), and will have a relatively high reliability or a high likelihood of being correctly decoded, and bits encoded in low capacity sub-channels will have low reliability or a low possibility to be correctly decoded. The fraction of perfect bit-channels is equal to the capacity of a channel.

SUMMARY

A method according to an embodiment involves receiving a word that is based on a codeword. The codeword was generated based on a generator matrix for a polar code and an input vector that includes information symbols. The method also involves applying multiple-symbol combination based decoding to the received word. The multiple-symbol combination based decoding involves: determining whether all nodes at an intermediate stage of the multiple-symbol combination based decoding, which provide their outputs as inputs to a subset of nodes at a next stage of the multiple-symbol combination based decoding, are associated with trust symbols in the received word that have a higher reliability of being successfully decoded than doubt symbols in the received word; and performing a hard decision in response to determining that all of the nodes at the intermediate stage, which provide their outputs as inputs to the subset of nodes at the next stage of the multiple-symbol combination based decoding, are associated with trust symbols.

A non-transitory processor-readable medium could be used to store instructions which, when executed by one or more processors, cause the one or more processors to perform such a method.

An apparatus according to another embodiment includes a receiver for receiving a word that is based on the codeword, and a processor coupled to the receiver. The processor is configured to apply the multiple-symbol combination based decoding to the received word.

In an embodiment, the multiple-symbol combination based decoding involves List decoding.

In an embodiment, at least one of the information symbols in the input vector is a non-binary symbol.

In an embodiment, the input vector includes at least one frozen symbol.

In an embodiment, the received word includes information symbol positions, which are known to both the encoder and decoder, and the method further involves determining which of the information symbol positions in the received word are trust symbol positions and doubt symbol positions, and determining whether all nodes at an intermediate stage, which provide their outputs as inputs to a subset of nodes at a next stage of the multiple-symbol combination based decoding, are associated with trust symbols is based on the determined trust symbol positions.

In a processor-based embodiment in which the received word comprises a plurality of information symbol positions, the processor could be further configured to determine which of the information symbol positions in the received word are trust symbol positions and doubt symbol positions, and configured to determine whether all nodes at an intermediate stage, which provide their outputs as inputs to a subset of nodes at a next stage of the multiple-symbol combination based decoding, are associated with trust symbols based on the determined trust symbol positions In an embodiment, the method also involves receiving information indicative of a number of the symbol positions in the received word that are trust symbol positions, and determining which of the symbol positions in the received word are trust symbol positions and doubt symbol positions is based on the received information.

Similarly, in a processor-based embodiment, the processor could be further configured to receive information indicative of a number of the information symbol positions in the received word that are trust symbol positions, wherein the processor is configured to determine which of the information symbol positions in the received word are trust symbol positions and doubt symbol positions based on the received information.

In an embodiment, determining which of the symbol positions in the received word are trust symbol positions and doubt symbol positions is based on one or more of: a decoding complexity and an error performance.

In a processor-based embodiment, the processor could be configured to determine which of the symbol positions in the received word are trust symbol positions and doubt symbol positions based on one or more of: a decoding complexity and an error performance.

Other aspects and features of embodiments of the present disclosure will become apparent to those ordinarily skilled in the art upon review of the following description.

BRIEF DESCRIPTION OF THE DRAWINGS

Examples of embodiments of the invention will now be described in greater detail with reference to the accompanying drawings.

FIG. 1 is a diagram showing how a polar coding generator matrix can be produced from a kernel.

DETAILED DESCRIPTION

Polar codes are disclosed herein as an example of structured capacity-achieving channel codes. The error detection coding techniques as disclosed herein could be applied in conjunction with polar codes, for control channel coding in $5^{th}$ Generation New Radio (NR), for example. Aspects of the present disclosure could be applied to types of codes other than polar codes, and/or to other types of communications than control channel communications.

In an embodiment, code length N of a polar code is power of 2. FIG. 1 is a diagram showing, by way of an illustrative example, how a polar coding generator matrix can be produced from a kernel $G_2$ 100. Note that FIG. 1 is an example. Other forms of kernels are also possible.

The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$.

A polar code can be formed from a Kronecker product matrix based on matrix $F=G_2$ 100. For a polar code having codewords of length $N=2^m$, the generator matrix is $G_2^{\otimes m}$.

Figure 2A:
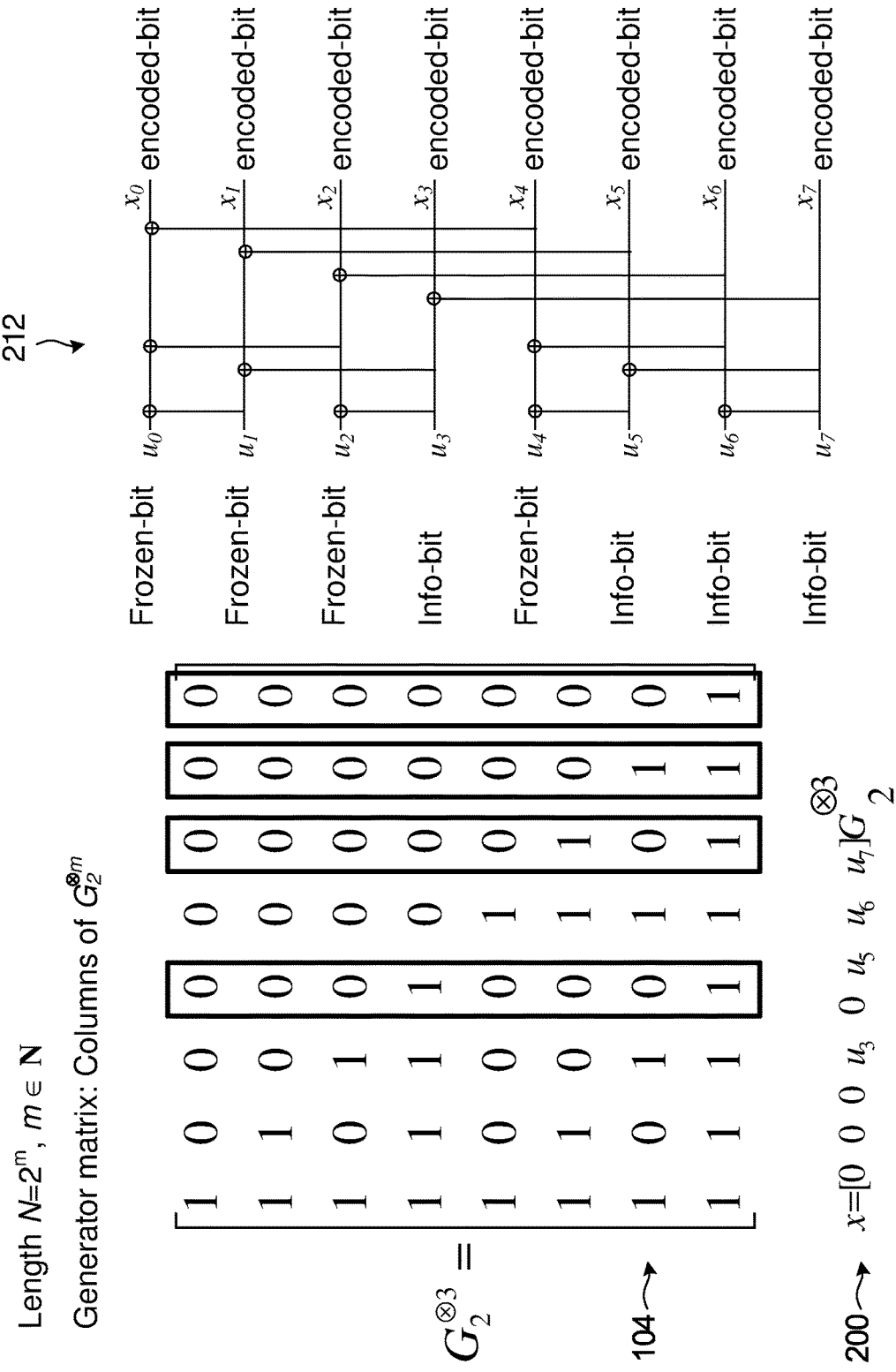
FIG. 2A is a diagram showing an example use of a polar coding generator matrix for producing codewords and a schematic illustration of an example polar encoder.

FIG. 2A is a diagram showing an example use of a polar coding generator matrix for producing codewords and a schematic illustration of an example polar encoder. In FIG. 2A, the generator matrix $G_2^{\otimes 3}$ 104 is used to produce codewords of length $2^3=8$. A codeword x is formed by the product of an input vector $u=[0\ 0\ 0\ u_3\ 0\ u_5\ u_6\ u_7]$ and the generator matrix $G_2^{\otimes 3}$ 104 as indicated at 200.

The input vector u is composed of information bits and fixed or frozen bits. In the specific example shown in FIG. 2A, N=8, so the input vector u is an 8-bit vector, and the codeword x is an 8-bit vector. The input vector has frozen bits in positions 0, 1, 2 and 4, and has information bits at positions 3, 5, 6, and 7. An example implementation of a coder that generates codewords is indicated at 212, where the frozen bits are all set to 0, and the circled "+" symbols represent modulo 2 addition. For the example of FIG. 2A, an N=8-bit input vector is formed from K=4 information bits and N–K=4 frozen bits. Codes of this form are referred to as polar codes and the encoder is referred to as a polar encoder. Decoders for decoding polar codes are referred to as polar decoders. Frozen bits are set to zero in the example shown in FIG. 2A. However, frozen bits could be set to other bit values that are known to both an encoder and a decoder. In theory, the frozen bits can be set to any value so long as the value and location of the frozen bits is known to both the encoder and the decoder. In conventional applications, the frozen bits are all set to zero. For ease of description, all-zero frozen bits are considered herein, and may be generally preferred.

As is known, polar coding may be performed with or without bit reversal. The example polar encoder in FIG. 2 is without bit reversal.

Generally, the output of a polar encoder can be expressed as $x_0^{N-1}=u_0^{N-1}G_N$, where, without bit reversal, $G_N=F^{\otimes n}$ is an N-by-N generator matrix, $N=2^n$, $n \geq 1$. (e.g. for n=1, $G_2$=F (indicated as 100 in FIG. 1)). For bit reversal, $G_N=B_N F^{\otimes n}$, where $B_N$ is an N-by-N bit-reversal permutation matrix.

Embodiments disclosed herein could be implemented without or with bit reversal.

A specific example of a polar code was described above in which the code is based on a generator matrix that is the m-fold Kronecker product of a specific kernel matrix $G_2$. The use of such a generator matrix results in polarization of sub-channels. When using successive cancellation (SC) decoding to decode codes of this form, some of the sub-channels will become noiseless channels, and some of the sub-channels will become totally noisy channels. The sub-channels are polarized. More generally, any generator matrix that produces a channel polarization effect will be referred to herein as a polar code generator matrix.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate of the physical channel. A reliability sequence (reliable and unreliable positions) may be calculated based on assumed or measured characteristics of the physical channel before the information is transmitted over the channel.

With a sufficiently long code length, a code designed according to polarization theory can reach the channel capacity in a binary memoryless channel if a Successive Cancellation (SC) decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^{20}$ bits in an AWGN channel. Such a long code length is impractical in wireless communications, for example.

Assistant or error-detection code (EDC) bits can be included in the input vector to assist in decoding. A cyclic redundancy check (CRC) code could be used as an EDC. However, it should be understood that other EDCs, such as a checksum code or a Fletcher Code, may be used. EDCs are sometimes known as error-correcting codes (ECCs). For descriptive simplicity, some embodiments described herein use a CRC code as an illustrative example of an EDC. More than one EDC could be used within one codeword.

CRC bits, for example, are generated based on the information bits being transmitted. CRC bits are generally placed in the more reliable positions in the input vector, although CRC bits may also be placed in other positions in the input vector. CRC bits may be used in path selection for List decoding, for example, to improve polar code performance. During encoding, an N-bit input vector is formed from K information bits, a u-bit CRC, and (N-K-u) frozen bits. Starting with K information bits, a u-bit CRC is calculated and appended to the K information bits to produce a set of input bits including the K information bits and the u-bit CRC. The (N-K-u) frozen bits are inserted to produce an N-bit input vector, where N is a power of 2. The input vector is then multiplied by a generator matrix for a polar code to produce an N-bit codeword. This separately designates the K information bits and a u-bit CRC. However, in other embodiments, CRC bits could be included within the K bits that are to be encoded, such that an N-bit input vector could include K bits (including both information bits and CRC bits), and (N−K) frozen bits. This is simply a matter of notation. In embodiments disclosed herein, an input vector may include information bits, error detection coding bits, and frozen bits.

The codeword is transmitted over a channel, and a receiver, in turn, receives a received word. Due to channel effects such as noise, the received word might not be identical to the transmitted codeword. A decoder attempts to decode the received word to determine information bits in the original input vector.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits including the CRC bits are unknown bits. Some polar decoders use SC decoding as noted above, in which the unknown bits are decoded sequentially and successive cancellation is applied. Once a particular decision has been made regarding how an unknown bit is to be decoded, SC polar decoders do not allow that bit to be changed or corrected, and the decoder moves on to decoding the next unknown bit. A bit that was set at step i cannot be changed at step j>i. In addition, knowledge of the value of subsequent frozen bits is not taken into account, i.e., subsequent frozen bits, even though known to the decoder, are not used to help decode the current unknown bit.

In Arikan, a successive-cancellation algorithm is described for decoding polar codes. Another type of polar decoding algorithm with better error correction performance, referred to as a List decoder, is described in "List Decoding of Polar Codes" by Tal and Vardy, *Proceedings of the* 2011 *IEEE International Symposium on Information Theory*, pp. 1-5 (July 2011). In a List decoder, successive levels of a binary decision tree are generated, each level corresponding to a decision on a respective unknown bit. Each (decoding) path in the decision tree from the root node to leaf nodes represents a possible partial decoded sequence of unknown bits and has a corresponding likelihood. The decision tree is generated in a breadth-first manner. During generation of the decision tree, at each level of the decision tree where the number of paths grows beyond a set threshold L, the L paths having the highest likelihood are identified, and the remaining paths are discarded. Some List decoders may also make use of CRC bits included in the codeword to assist in decoding. For example, if the codeword includes encoded CRC bits for the previous information bits, then once the decision tree is generated, each of the surviving paths that corresponds to the decoded information bits is checked against the CRC bits represented in each of the surviving paths. The decoder then outputs as a decoded vector the information bits in the surviving path that passes the CRC check. If more than two paths pass the CRC check, then the decoder selects for output the path that passes the CRC check and has the highest likelihood, which may be determined according to a metric. If no path passes the CRC check, or if the codeword does not include encoded CRC bits, then the decoder selects for output the path that has the highest likelihood, which may be determined according to a metric.

Thus, there are two types of the decoding based on successive cancellation, including SC decoding and List decoding, which is also referred to as SCL decoding. SC decoding is a special case of List decoding, with list size L=1. An SC decoder tracks only one decoding path. For every decoded bit, a decoding path generates 2 leaf branches (bit=0 or 1) for the next decoding bit. After the value of a decoded bit is estimated, the other possible value is ignored. Decoding continues with the next bit, assuming that each previous bit has been correctly estimated when updating partial sum results. List decoding can be further divided into (pure) List decoding in which survivor paths with the highest likelihood are selected and CRC-Aided SCL (CA-SCL) decoding where CRC bits are used for path selection during decoding or after decoding all the bits. Other decoding-assistant operations such as a parity check based on parity or "PC" bits that are included in an input vector, could be used instead of or jointly with CRC for path pruning or selection during decoding.

Pure SCL decoding, which does not use CRC or other error detection/correction codes for path pruning or selection, largely improves the performance of a polar code for a limited code length. However, compared with the similar code length and code rates of Low Density Parity Check (LDPC) codes and Turbo codes, pure SCL decoding may have a worse Block Error Rate (BLER) than well-designed LDPC and Turbo codes. CRC-aided SCL (CA-SCL) decoding may further improve the performance of a polar code with a limited code length. For example, a CA-SCL decoder with a list size L=32 could provide much better performance than LDPC and Turbo codes with similar computational complexity.

Computational complexity of a List decoder is directly determined by List size L. For successive cancellation in List decoding, the computational complexity is $O(L \cdot N \cdot \log_2(N))$. Computational complexity of the path metric updates in List decoding is $O(L \cdot (N-1))$, and computational complexity of path selection in List decoding is $R \cdot N \cdot O(2 \cdot L \cdot \log 2(2 \cdot L))$ when a quick-sorter is used in path selection. R is the coding rate, which is related to K and N as $R=K/N$. Implementation complexity of a List decoder is also determined by list size L. Implementation complexity for Log-Likelihood Ratio (LLR) memory is $O(L \cdot N)$, and implementation complexity for memory access is a function of L.

Reducing L, for a smaller list size in List decoding, reduces computational complexity and implementation complexity. However, for polar codes with a kernel shown in FIG. 1, a larger list size L is preferred for improved performance.

Figure 2B:
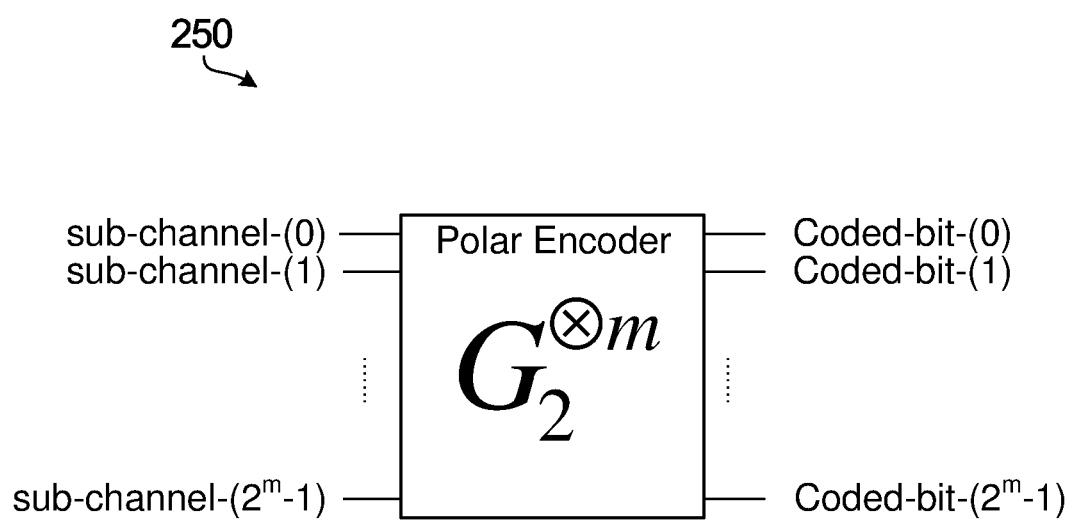
FIG. 2B is a block diagram illustrating an example of a polar encoder based on a 2-by-2 kernel.

Polar encoders based on Kronecker products of a 2-by-2 Arikan kernel $G_2$ are described above. FIG. 2B is a block diagram illustrating an example of a polar encoder 250 based on a 2-by-2 kernel. Sub-channels and coded bits are labeled in FIG. 2B. A channel is divided into N sub-channels by a polar code as noted above. An information block and frozen bits are allocated onto the N sub-channels, and the resultant N-sized vector is multiplied with an N-by-N Kronecker matrix by the polar encoder 250 to generate a codeword that includes N coded bits. An information block includes at least information bits and could also include assistant bits such as CRC bits or PC bits. A sub-channel selector (not shown) could be coupled to the polar encoder 250 to select sub-channels for information bits and any assistant bits, with any remaining sub-channels being frozen sub-channels.

For polar codes that are based on a 2-by-2 kernel and an N-by-N Kronecker matrix, N is a power of 2. This type of kernel and polar codes based on such a kernel are discussed herein as illustrative examples. Other forms of polarization kernels such as other prime-number kernels (e.g. 3-by-3 or 5-by-5) or combinations of (prime or non-prime number) kernels to produce higher-order kernels could yield polarization among code sub-channels. It should also be noted that coded bit processing such as puncturing, shortening, zero padding, and/or repetition could be used in conjunction with polar codes that are based on 2-by-2 kernels or other types of kernels, for rate matching and/or other purposes for example.

As a result of SC, SCL, or CA-SCL decoding, the polarization phenomenon appears over the sub-channels. Some sub-channels have high capacity, and some sub-channels have low capacity. Put another way, some sub-channels have equivalently high Signal-to-Noise Ratio (SNR) and others have low SNR. These metrics are examples of characteristics that could be used to quantify or classify sub-channel "reliability". Other metrics indicative of sub-channel reliability can also be used.

Code construction involves determining a code rate (the number of information bits K, or how many sub-channels are to carry information bits) and selecting the particular K sub-channels among the N available sub-channels that are to carry information bits. For ease of reference herein, information bits could include input bits that are to be encoded, and possibly CRC bits, PC bits, and/or other assistant bits that are used to assist in decoding. Sub-channel selection is based on reliabilities of the sub-channels, and typically the highest reliability sub-channels are selected as information sub-channels for carrying information bits.

Sub-channel reliabilities could be specified, for example, in one or more ordered sequences. A single, nested, SNR-independent ordered sequence of sub-channels could be computed for a code length $N_{max}$, with ordered sequences for shorter code lengths N being selected from the longer $N_{max}$ sequence. Multiple ordered sequences in terms of different mother code lengths $N_i$ could instead be computed, and one of the mother code length sequences could be selected for a particular code based on preferred code length. Another possible option involves computing multiple ordered sequences in terms of SNR values, for example, and selecting an ordered sequence based on measured SNR.

Although tracking multiple decoding paths as in SCL decoding may offer better decoding performance than single-path tracking as in SC decoders, multi-path decoder size and complexity increases with codeword length and with list size L. For example, for a codeword length $N=8$ with a 2-by-2 kernel, there are $2^8 = 256$ possibilities for estimated values $\hat{u}_0$ to $\hat{u}_7$. As codeword length increases, the number of possibilities grows exponentially, and tracking of all decoding paths for all combinations of $\hat{u}_x$ becomes impractical. By tracking multiple decoding paths according to a list of size L, SCL decoders may still offer better decoding performance than SC decoders, with reasonable size and complexity. An SCL decoder monitors the best L decoding paths and estimates information bit values for the L decoding paths by combining Log Likelihood Ratio (LLR) values with previously computed partial sum values.

Each decoding path from the root (decoded bit #0) of a decoding tree is associated with a Path Metric (PM). A decoding path appends each newly decoded bit to previous estimated values. After the LLR computations for each decoded bit, path metrics are continuously updated for each decoding bit (both frozen bits and information bits) using the LLR values as follows:

if the LLR value>=0
  PM[0, i+1]=PM[i]
  PM[1, i+1]=PM[i]+|LLR|
if the LLR value<0
  PM[0, i+1]=PM[i]+|LLR|
  PM[1, i+1]=PM[i].

The best decoding paths have the smallest PM values. If an LLR is less than 0, then the decoded bit is most likely a 1, so the next PM for the estimated value 1 (PM[1, i+1]) remains the same as the current path metric, and the absolute LLR value is added to the PM for the estimated value 0 (PM[0, i+1]), in effect "penalizing" the less likely path with the absolute LLR value. If the LLR value is near 0, then the decision for the value of $\hat{u}_x$ is unreliable and the PM penalty on the penalized path is small.

For every decoded bit in a decoding tree, each decoding path produces several new decoding paths. By way of example, binary decoding, which generates 2 new decoding paths for a 2-by-2 kernel, is described herein. Such decoding may also or instead be applied in general polar decoding.

Each "leaf" decoding path inherits the LLR, partial sum, and PM values from its parent. After the number of decoding paths reaches L, an SCL decoder selects, based on the 2L PMs for the 2L candidate decoding paths, the L paths with the lowest PMs, and drops the other L decoding paths. The selected L paths are sorted using the PMs. For example, path sorting could assign path identifiers (IDs) or indices to the selected paths, with the path having the best PM being assigned a path ID #1, a path with the worst PM being assigned path ID #L, and other paths being assigned path IDs #2 to #(L-1) in accordance with their PMs. New decoding path IDs could be assigned after each sort step, following estimation of each codeword bit.

Figure 3:
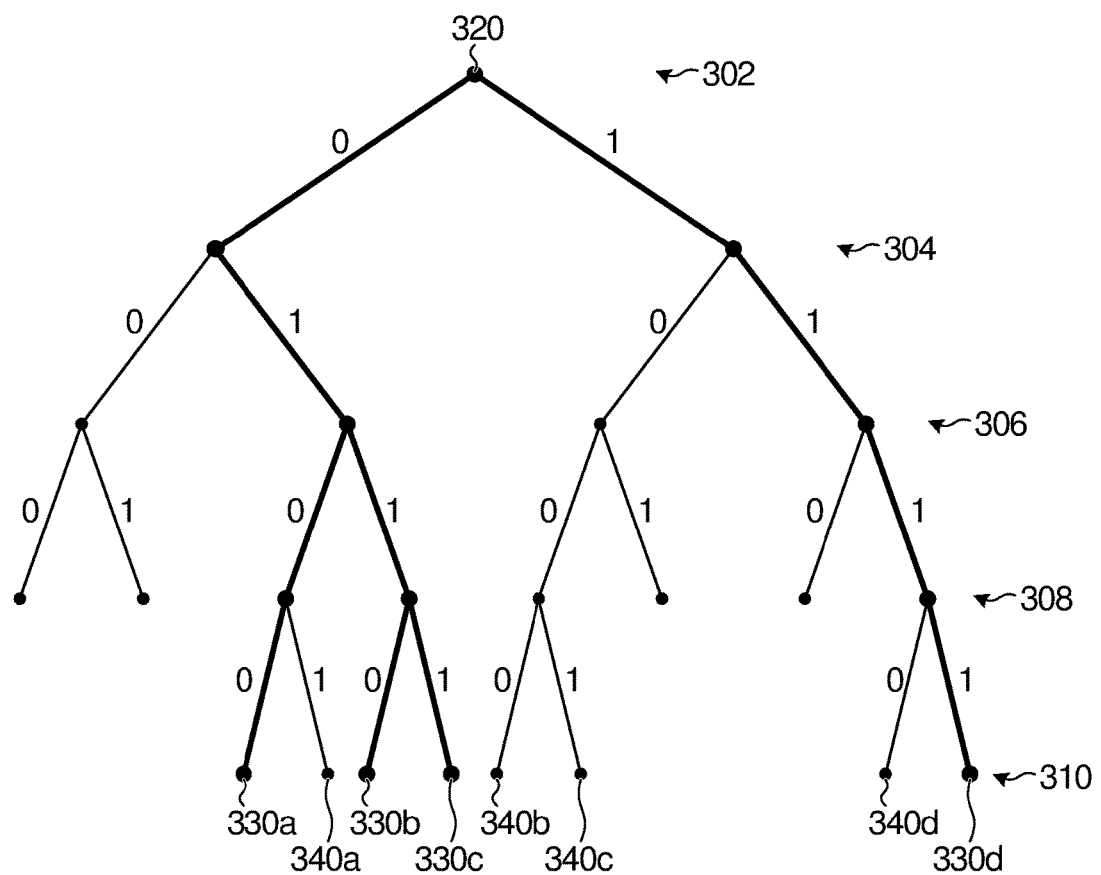
FIG. 3 is a diagram showing a portion of an example decision list tree whose width is limited by a maximum given list size and used in an SCL polar decoder.

FIG. 3 is a diagram showing a portion of an example decision tree used in an SCL polar decoder, whose width is limited by a maximum list size L. In FIG. 3 the list size L is set to 4. Five levels 302, 304, 306, 308, 310 of the decision tree are illustrated, and are referred to as levels 0, 1, 2, 3, and 4, respectively. Although five levels are illustrated, it should be understood that a decision tree to decode M unknown bits would have M+1 levels. At each level after the root level 302, each one of up to 4 surviving decoding paths is extended by one bit. The leaf or child nodes of root node 320 represent possible choices for a first unknown bit, and subsequent leaf or child nodes represent possible choices for subsequent bits. The decoding path from the root node 320 to leaf node 330a, for example, represents the following possible partial decoded unknown bit sequence: 0, 1, 0, 0. At level 3 (308), the number of possible paths is greater than L, so L paths having the highest likelihood (e.g. best PMS) are identified, and the remaining paths are discarded. The decoding paths that survive after the path sort at level 306 are shown in bold in FIG. 3. Similarly, at level 4 (310), the number of possible paths is again greater than L, so L paths having the highest likelihood (e.g. best PMS) are identified, and the remaining paths are again discarded. In the example shown, the paths terminating in leaf nodes 330a, 330b, 330c, and 330d represent the highest likelihood paths. Each of these highest likelihood paths is drawn with thick lines. The paths terminating in leaf nodes 340a, 340b, 340c, 340d are the lower likelihood paths which will be discarded.

The examples described above relate to binary encoding and decoding of information bits. A general polarization kernel and polar coding using generator matrices formed from such a kernel are also contemplated. For example, a Kronecker product could be used to form generator matrices from a general polarization kernel. A general polarization kernel may be used in coding non-binary information symbols. An information symbol includes one or more bits, and in embodiments disclosed herein at least one information symbol is a multi-bit symbol.

A general polarization kernel is an l-dimension kernel g( ) over alphabet F, and is polarized. The frame error rate of polar codes that use a polarized kernel with exponent E satisfies $P_e = o(2^{-N^\beta})$ for $\beta < E$. E is an upper bound in this example. The kernel $G_2$ 100 in FIG. 1, which is also expressed as (u+v, v), has an exponent E of 0.5. Kernels with a larger exponent E have a better frame error performance at the same block length. In other words, other forms of kernel that polarize faster may have better frame error performance. For example, by selecting an appropriate kernel on the Galois Field, it may be possible to construct a symbol-based polar code to have better polarization and better performance.

Figure 4:
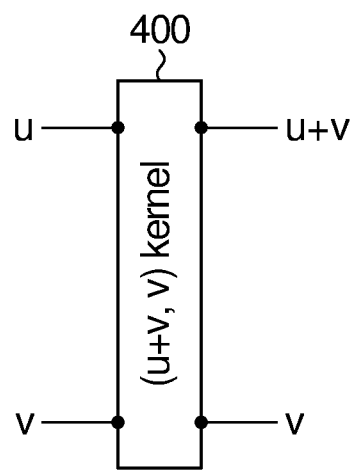
FIG. 4 is a block diagram of a binary encoder kernel.

FIG. 4 is a block diagram of a binary encoder kernel 400. An input vector with bits [u v] are multiplied by the kernel 400, which is also shown as $G_2$ 100 in FIG. 1, to generate an output vector with bits [(u+v)v].

Figure 5:
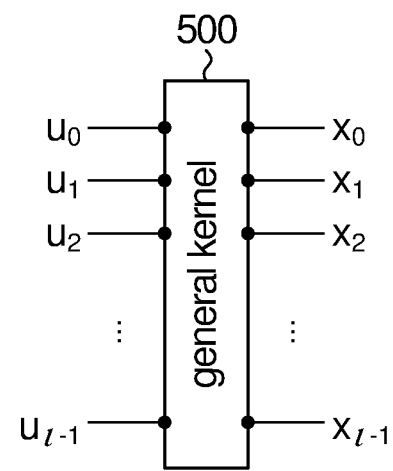
FIG. 5 is a block diagram of an example general polar encoder kernel.

FIG. 5 is a block diagram of an example general polar encoder kernel 500. The input vector is a vector of symbols $[u_0 \ldots u_{l-1}]$. The input vector includes at least one multi-bit symbol. The input vector could include bit symbols, multi-bit symbols, or a mix of bit and multi-bit symbols. A codeword with elements $[x_0 \ldots x_{l-1}]$ is generated by multiplying the input vector by the general polar encoder kernel 500. An example of a general polar encoder kernel is described in a U.S. Provisional Patent Application No. 62/351,438, entitled "Systems and Methods for Piece-Wise Rate Matching When Using Polar Codes", filed on Jun. 17, 2016 and incorporated in its entirety herein by reference.

Figure 6:
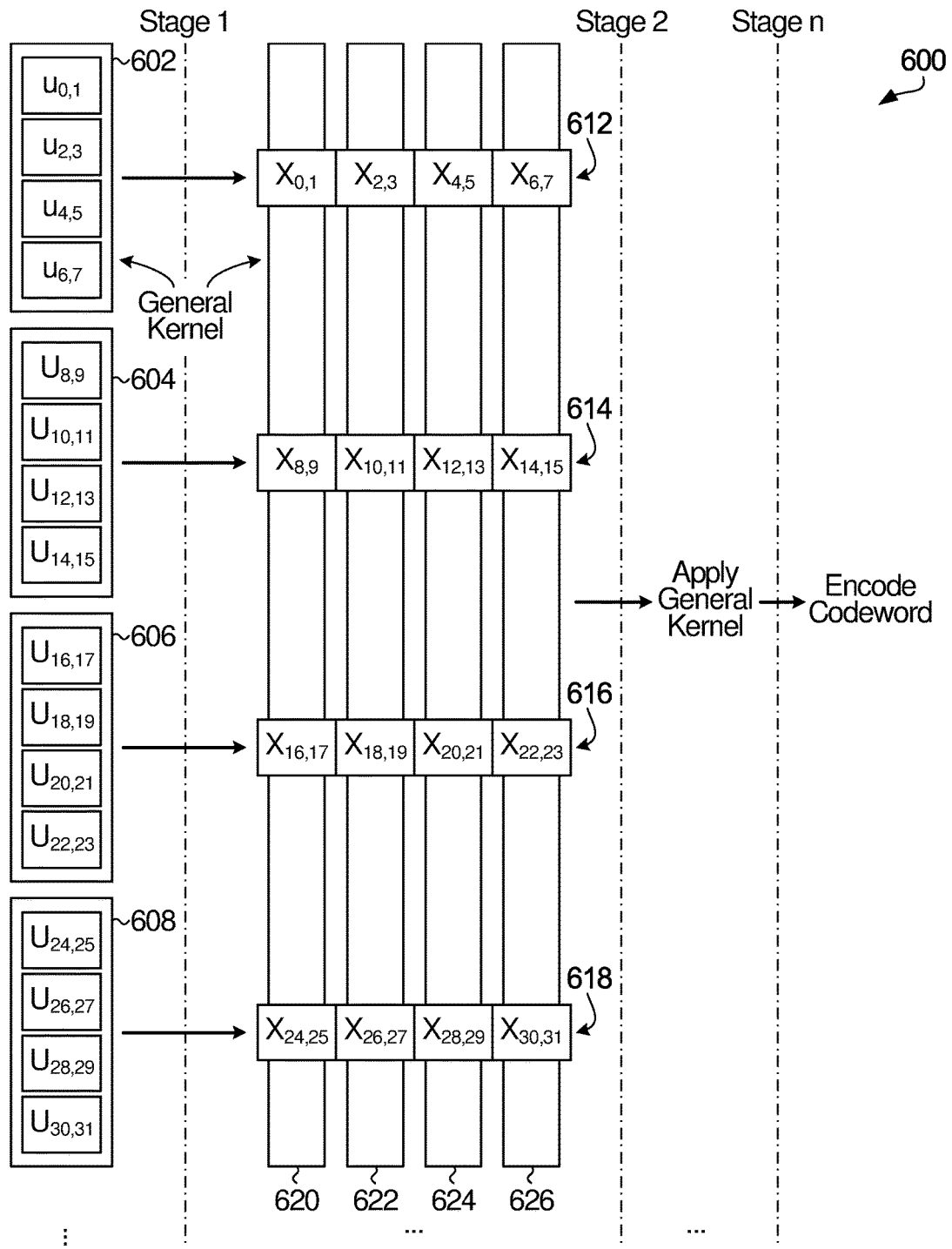
FIG. 6 is a block diagram illustrating an example recursive multi-layer general polar encoder.

FIG. 6 is a block diagram illustrating an example recursive multi-layer general polar encoder 600. An input vector of $N_{symbol}=l^n$ F-symbols $u_{0,1}, \ldots, u_{30,31}$ is to be encoded. In an embodiment, the input symbol set is an |F|-ary alphabet, which could be a quaternary alphabet for example. The input symbol notation $u_{0,1}, \ldots, u_{30,31}$ is intended to represent two-bit symbols in the example shown. In other embodiments, input symbols could have different lengths, and an input vector u for general polar coding could include both binary and non-binary input symbols.

The elements 602, 604, 606, 608 represent encoder elements that multiply input symbols by a general polar encoder kernel. Outputs from the stage 1 elements 602, 604, 606, 608 are shown at 612, 614, 616, 618. The elements 620, 622, 624, 626 represent encoder elements that multiply the stage 1 outputs 612, 614, 616, 618 by the general polar encoder kernel, to implement recursive multi-layer general polar encoding. Matrix multiplication by the encoder elements 602, 604, 606, 608, 620, 622, 624, 626 could be implemented using hardware such as matrix multipliers, or a combination of adders and multipliers, firmware, and/or a processing element such as a microprocessor that executes software. Electronic devices that might be suitable for implementing matrix multiplication include, among others, microprocessors, microcontrollers, Programmable Logic Devices (PLDs), Field Programmable Gate Arrays (FPGAs), Application Specific Integrated Circuits (ASICs), and other types of "intelligent" integrated circuits. Software could be stored in memory for execution. The memory could include one or more physical memory devices, including any of various types of solid-state memory devices and/or memory devices with movable or even removable storage media.

Although only 2 stages or layers of encoding are shown in FIG. 6, this type of recursive encoding may be applied in n stages to obtain the encoded codeword for block length $l^n$ symbols.

Figure 7:
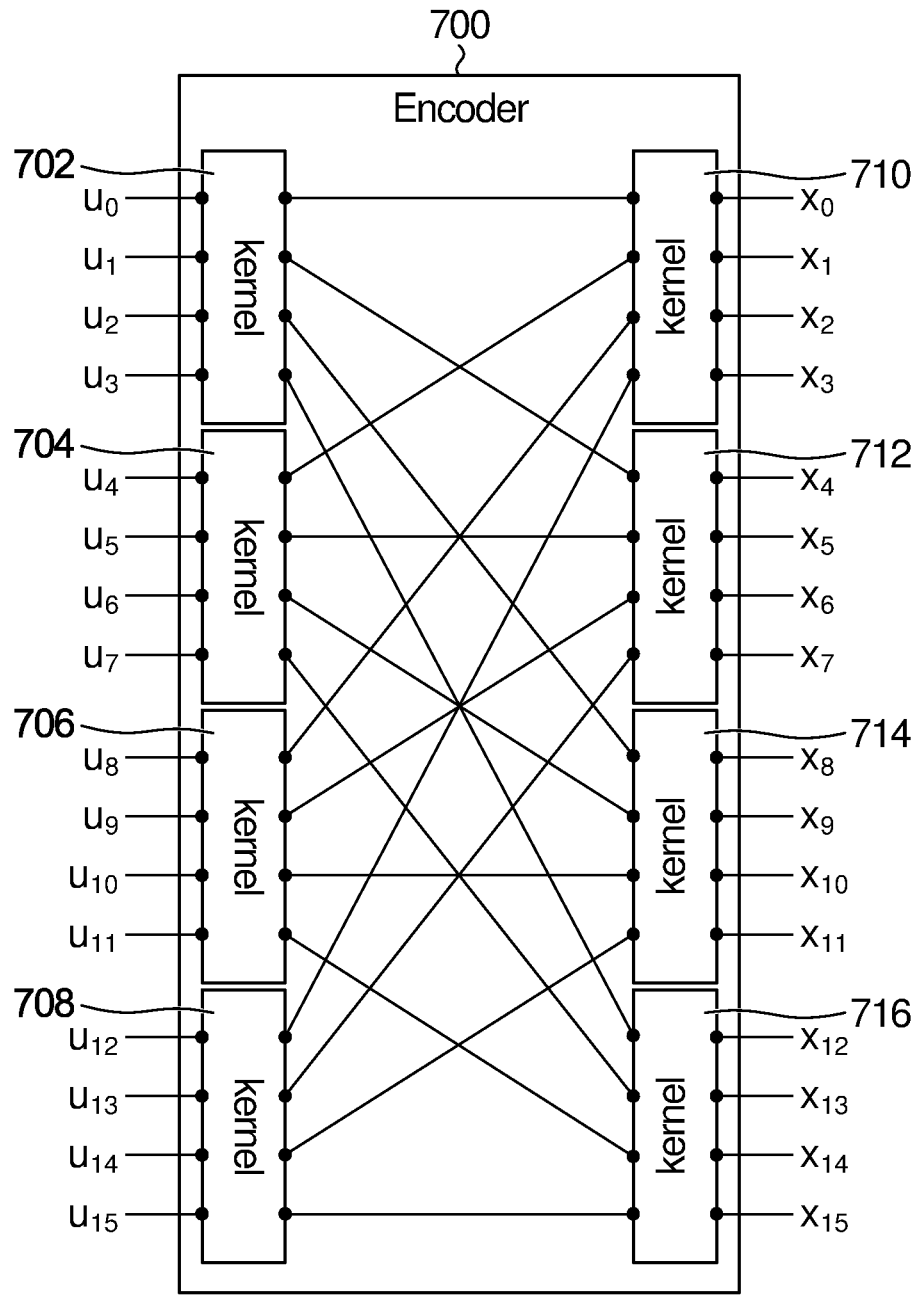
FIG. 7 is a block diagram illustrating another example recursive multi-layer general polar encoder.

FIG. 7 is a block diagram illustrating another example recursive multi-layer general polar encoder 700. In this example, l=4, $N_{symbol}$=16, and there are 2 layers of kernels (n=2). The elements 702, 704, 706, 708, 710, 712, 714, 716 perform symbol-level multiplication of symbols by a general polar encoder kernel. Example implementations of matrix multiplication are described above.

List decoding, described above in the context of binary polar coding, could also be applied to a general polar coding. Symbols could include one or more bits. For a q-ary symbol, i.e., a symbol including $\log_2(q)$ bits, the number of values the symbol may take is q. As a result, symbol likelihoods could be calculated based on bit likelihoods, for example.

In the decoding of general kernel polar codes with q-ary symbols, the LLR values for each symbol are a vector of LLR values, rather than a single LLR value for one bit in binary polar code. The single LLR value for one bit in binary polar code indicates the likelihood of this bit taking value 0 over value 1. The LLR vector of one q-ary symbol could have different expressions. For example, each entry of the vector could indicate the likelihood of this symbol taking one value over all the other values. Alternatively, each entry could indicate the likelihood of this symbol taking one particular value over each of the possible values. Take 4-ary symbol with value 0, 1, 2, 3 as a detailed example. The ith entry (i=1, 2, 3, or 4) could indicate the likelihood of this symbol taking value i over all the other 3 values, or it could indicate that of this symbol taking value 0 over value i. In addition, when making a decoding decision for a q-ary doubt information symbol in SCL decoding, one path will be extended to q paths, each corresponding to one value that the symbol may take, instead of 2 paths in binary polar code.

Figure 8:
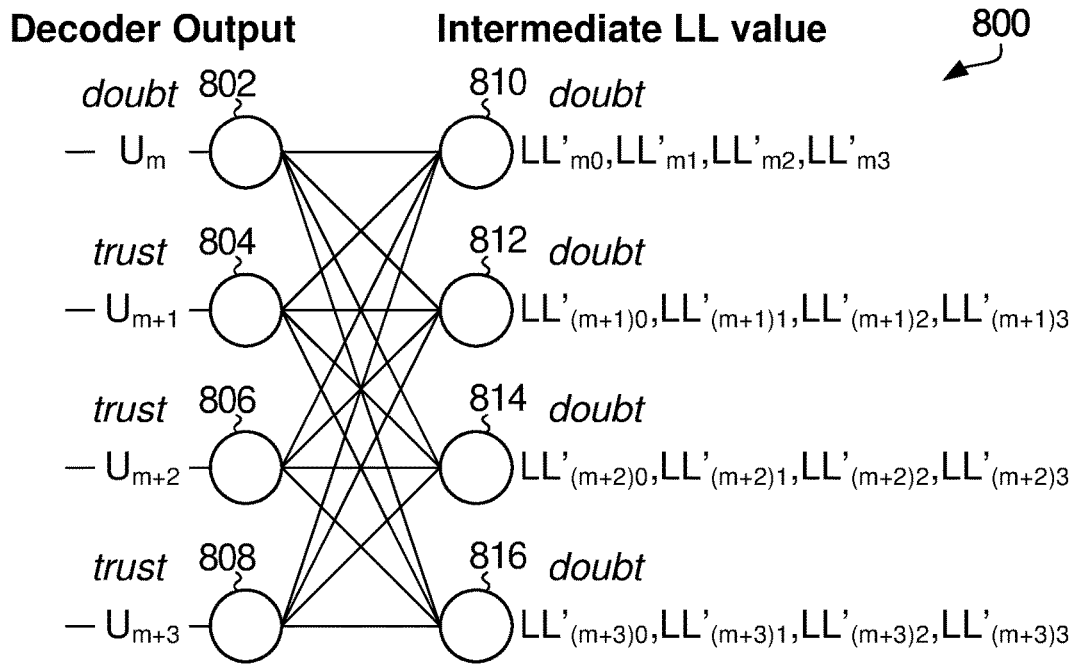
FIG. 8 is a block diagram illustrating an example multiple-symbol combination based decoder with likelihood inputs for doubt symbols at intermediate nodes.

FIG. 8 is a block diagram illustrating an example multiple-symbol combination based decoder 800 with likelihood inputs for doubt symbols at intermediate nodes 810, 812, 814, 816. The example decoder 800 also includes decision nodes 802, 804, 806, 808. The intermediate stage nodes 810, 812, 814, 816 represent elements that perform intermediate stage decoding based on likelihoods, and the decision nodes 802, 804, 806, 808 represent elements that perform final stage decoding to provide decoder outputs. Although only one intermediate stage with nodes 810, 812, 814, 816 is shown in FIG. 8, additional intermediate stages could be provided in other embodiments. For example, the intermediate stage in FIG. 8 is just before the final stage. Another intermediate stage could be providing the inputs to the intermediate stage in FIG. 8. There could be multiple intermediate stages, and the techniques disclosed herein could be applied at all intermediate stages, regardless of how far those stages are from the final stage.

The multiple-symbol combination based decoder 800, with at least one intermediate decoding stage and a final decoding stage as shown, could be implemented using hardware, firmware, and/or a processing element such as a microprocessor that executes software. Examples of electronic devices that might be suitable for such implementations, and examples of memory for storing software for execution, are described herein.

Due to successive cancellation, decoding parallelism of a general polar decoder tends to be very limited. The theoretical latency of a polar code is related to the number of decoding steps or stages. Reliability properties of a polar code, however, may be exploited during decoding as described herein, to potentially reduce decoding latency.

Bit positions in an input vector for binary polar coding have different reliabilities, as described above. In general polar coding, symbol positions in an input vector also have different reliabilities. Symbols may be binary or non-binary, and in this sense binary polar coding could be considered a special case of general polar coding.

For example, if all the input symbols ($u_0, \ldots, u_{l-1}$) to a general polarization kernel such as the kernel 500 in FIG. 5 are trust symbols, then all of the output symbols ($x_0, \ldots, x_{l-1}$) from that kernel could be considered to be "trust" symbols with a higher reliability or likelihood of being decoded correctly, or considered to correspond to trust symbols or trust symbol positions. If at least one of the input symbols to a general polarization kernel is a "doubt" symbol with a lower reliability or likelihood of being decoded correctly, then all of the output symbols from that kernel could be considered doubt symbols. Other trust/doubt designations are also possible.

Information symbols can be divided into these two categories of symbols. Trust symbols are symbols with a higher reliability of being decoded accurately. Doubt symbols are symbols with lower reliability of being decoded accurately.

Dividing the information symbols into the two categories may be performed as follows.

A first step may involve sorting information symbols in descending order based on reliability, i.e. $\{r_1, r_2, r_3 \ldots r_m\}$, wherein r is the reliability and m is a number of information symbols. Of the total m information symbols, a number of symbols ($K_{trust}$) are selected as the trust symbols having the largest or highest reliabilities. The remaining symbols are allocated as doubt symbols. $K_{trust}$ is an empirical value and may be selected based on a selection criterion. Examples of selection criteria include decoding complexity and an error performance requirement. The larger the $K_{trust}$ value, the more trust symbols are allocated. This can result in a lower decoder complexity, but possibly a worse error performance. The smaller the $K_{trust}$ value, the less trust symbols are allocated. This can result in a higher decoder complexity, but possibly better error performance. With a larger number of symbols being allocated as trust symbols there is a greater chance of some of those trust symbols at a lower end of the "trust" reliability range not being particularly reliably decoded, and thus negatively affecting the decoding performance.

Information that is indicative of $K_{trust}$ could be received by a receiver or decoder, or the decoder or another receiver element could calculate $K_{trust}$ based on one or more selection criteria such as those described above.

In another embodiment, a number of symbols ($K_{doubt}$) are selected as doubt symbols having the smallest or lowest reliabilities, and the remaining symbols are trust symbols. Either trust symbols or doubt symbols could be selected from among a total number of symbols.

As an example, when N=2048, 70% of all the information positions could be taken as trust positions with nearly no performance loss in some embodiments. If 80% of all the information positions are designated as trust positions, then there could also be very little performance loss.

Symbol reliabilities could be taken into account in selective path extension during List decoding, for example, as described in a U.S. Provisional Patent Application No. 62/351,542 entitled "SELECTIVE PATH EXTENSION FOR LIST DECODING OF GENERAL POLARIZATION CODING", filed on Jun. 17, 2016 and incorporated in its entirety herein by reference.

The multiple-symbol combination based decoder 800 in FIG. 8 could also be configured to exploit the different symbol reliabilities in reducing likelihood-based processing during decoding. In the example shown in FIG. 8, the intermediate nodes that provide outputs to the next stage (in this example the final stage nodes 802, 804, 806, 808) are associated with doubt symbols. The log likelihood values LL' received by the intermediate nodes 810, 812, 814, 816 are also associated with doubt symbols. In this example, the decoder 800 performs likelihood-based decoding by calculating the LL values for the next stage, and decoding decisions are made in the final stage at 802, 804, 806, 808.

Regarding the LL' notation in FIG. 8, if there are N symbols to decode, then "m" denotes the m-th symbol among these N symbols. The notation "(m+1)0", for example, denotes the first LL' value for the (m+1)th symbol position during an LL update procedure. Similarly, "(m+1)1" denotes the second LL' value for (m+1)th symbol position during the LL update procedure, and so on. In this example, the symbol alphabet is quarternary, hence the 0, . . . , 3 notation.

Figure 9:
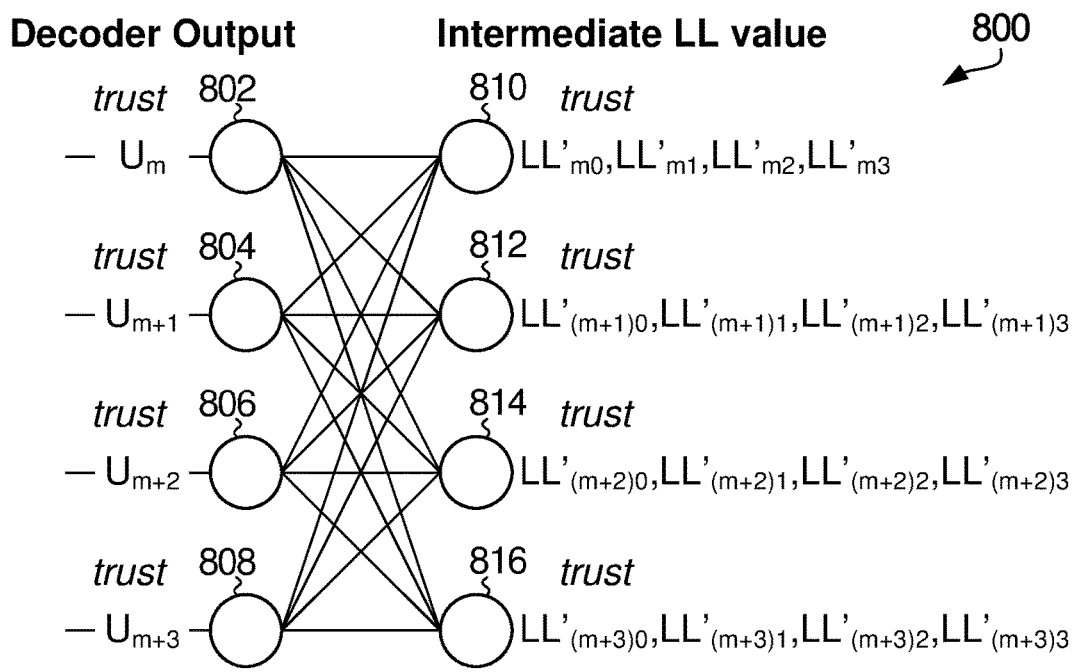
FIG. 9 is a block diagram illustrating an example multiple-symbol combination based decoder with likelihood inputs for trust symbols at intermediate nodes.

FIG. 9 is a block diagram illustrating the multiple-symbol combination based decoder 800 with likelihood inputs for trust symbols at the intermediate nodes 810, 812, 814, 816. In this case, according to an embodiment, the intermediate nodes 810, 812, 814, 816 perform hard decisions based on the likelihood values LL'. In an embodiment, a symbol value associated with the highest likelihood value LL' is selected at each intermediate node 810, 812, 814, 816 as a hard decision value. The LL update process that is performed for conventional likelihood-based decoding stops here. Hard decoding can then be performed for the following next stages as well, whether the next stages include other intermediate stages or a final stage as shown.

Although all of the intermediate nodes 810, 812, 814, 816 in FIG. 9 are associated with trust symbols, there could be other intermediate nodes that are connected to other final stage nodes or to other intermediate nodes. An all-trust symbol determination need not apply to every intermediate node. If all intermediate nodes that provide outputs to a subset of nodes at a next decoding stage are associated with trust symbols, then an all-trust symbol determination is made for those intermediate nodes, which might not include every intermediate node.

Exploiting symbol reliabilities as disclosed herein could reduce the calculations and/or storage requirements for LL updates during SC-List decoding, including the special case of SC decoding with list size 1, while potentially providing the same performance as partial list decoding. There is no limit on the number of all-trust symbols for which hard decision at an intermediate stage could be applied. Especially in the case of low-code-rates, the throughput improvement could be significant.

Figure 10A:
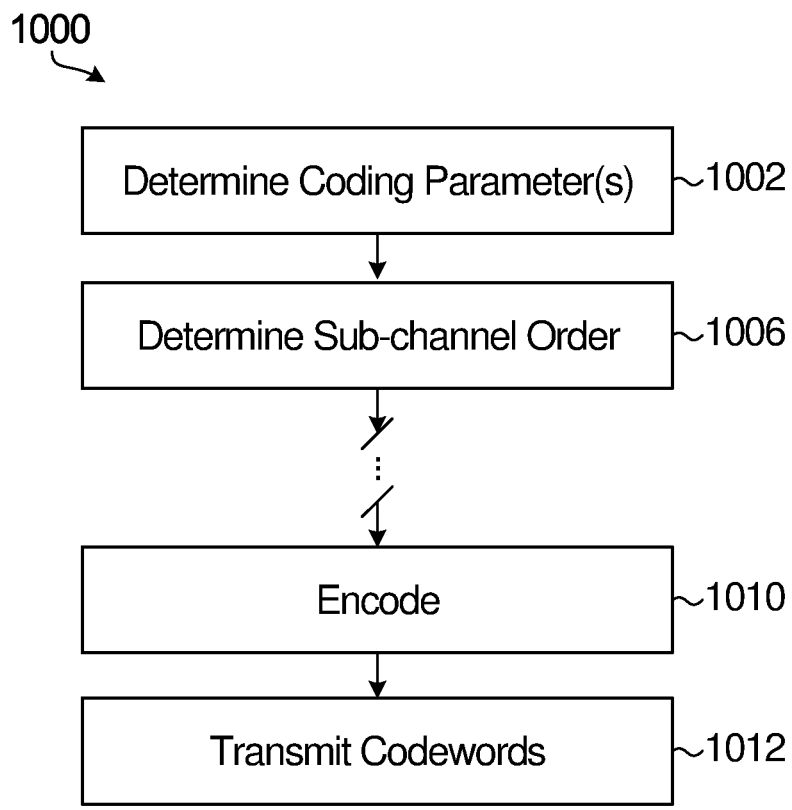
FIG. 10A is a flow diagram illustrating an example encoding method.

FIG. 10A is a flow diagram illustrating an example encoding method. The illustrated example method 1000 includes determining one or more coding parameters at 1002. The coding parameter(s) could include at least a mother code rate N, which could be read from memory or otherwise provided. N could be computed based on a given K and a given code rate R, for example. At 1006, an order of coding sub-channels (either bit sub-channel or symbol sub-channel) is determined as disclosed herein. A rule set could be used to reduce the number of reliability computations and polynomial comparisons that are involved in determining sub-channel order at 1006, for example, which could make it feasible to determine sub-channel order online when information is to be encoded or decoded. Trust or doubt symbols or symbol positions may also be determined at 1002 or 1006.

An ordered sub-channel sequence as determined at 1006 could be used to select information sub-channels, frozen sub-channels, and/or other types of sub-channels when information is to be encoded at 1010. Codewords are then transmitted at 1012.

The example method in FIG. 10A is intended for illustrative purposes. Other embodiments could involve performing the illustrated operations in any of various ways, performing fewer or additional operations, and/or varying the order in which operations are performed.

Figure 10B:
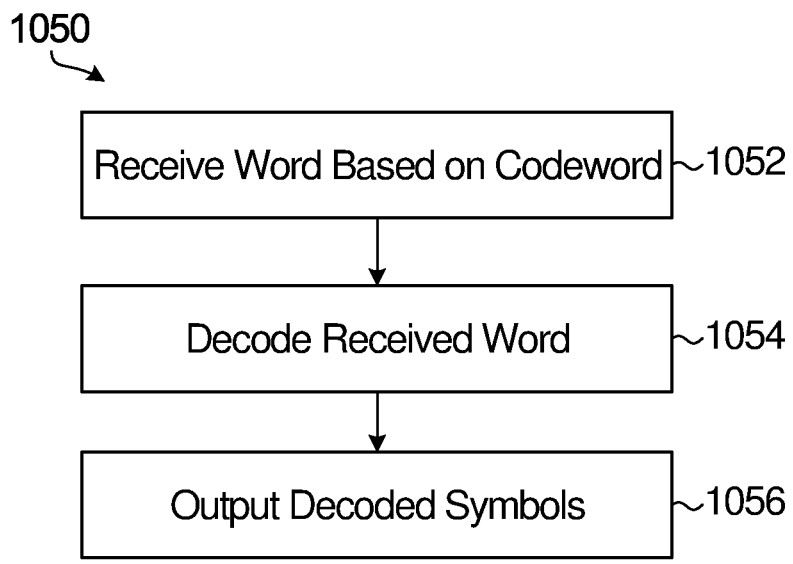
FIG. 10B is a flow diagram illustrating an example decoding method.

FIG. 10B is a flow diagram illustrating an example decoding method. The example method 1050 involves receiving at 1052 a word that is based on a codeword of a code, decoding the received word at 1054, and outputting decoded symbols at 1056, which could be further transformed into bits. The decoding at 1054 is in accordance with embodiments disclosed herein.

Like the example method 1000, the example method 1050 is intended for illustrative purposes. Other embodiments could involve performing the illustrated operations in any of various ways, performing fewer or additional operations, and/or varying the order in which operations are performed. Other variations could be or become apparent to a skilled person based on the present disclosure.

Figure 11:
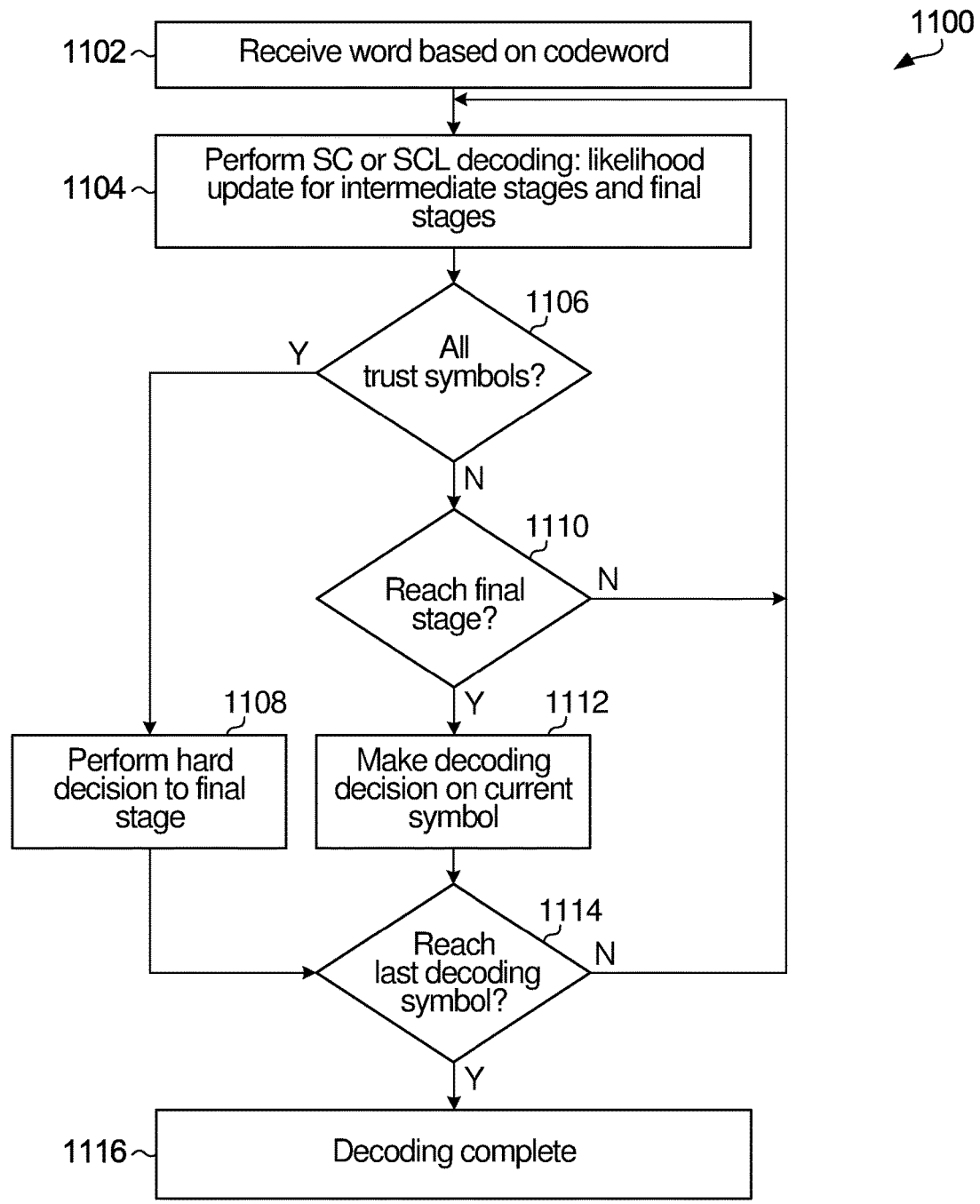
FIG. 11 is a flow diagram of an example method according to an embodiment.

FIG. 11 is a flow diagram of an example method according to an embodiment. The method 1100 includes receiving, at 1102, a word that is based on a codeword. The codeword was generated based on a generator matrix for a polar code and an input vector that includes information symbols. Multiple-symbol combination based decoding is applied to the received word. 1104 and 1112 are procedures from conventional SC/SCL decoding. At 1104, likelihood updates are performed. At 1112, decoding decisions on symbols are made as in conventional SC/SCL decoding. When SCL is used, decisions on path selection are made at 1112. The multiple-symbol combination based decoding includes intermediate stage decoding at 1106. The multiple-symbol combination based decoding also includes hard decision decoding at 1108 based on the intermediate stage determination made at 1106.

At 1106, a determination is made as to whether all of the nodes at an intermediate stage, which provide their outputs as inputs to a subset of nodes at a next stage of the multiple-symbol combination based decoding, are associated with trust symbols in the received word. A positive determination would be made in the input scenario shown in FIG. 9, for example. A hard decision is made at the intermediate stage, and the next stage(s) all the way to the final decoder output stage, at 1108 in response to a positive determination. Otherwise, if the final decoding stage has not been reached, then intermediate processing continues at 1104 at the next stage, and the all-trust symbol condition at 1106 is again checked. When the final stage is reached, as determined at 1110, a decoding decision on the current symbol is made at 1112. If there are any more symbols to decode, as determined at 1114, then the decoding procedure repeats. Otherwise, decoding for a current received word is complete, as shown at 1116, and decoded symbols could be output or otherwise provided for further processing, for example.

The example method 1100 is intended for illustrative purposes. Other embodiments could involve performing the illustrated operations in any of various ways, performing fewer or additional operations, and/or varying the order in which operations are performed.

Other variations could be or become apparent to a skilled person based on the present disclosure.

For example, FIG. 11 encompasses a method that involves receiving a word that is based on a codeword, wherein the codeword was generated as described above, based on a generator matrix for a polar code and an input vector that includes information symbols, and applying multiple-symbol combination based decoding to the received word. The multiple-symbol combination based decoding involves determining whether all nodes at an intermediate stage of the multiple-symbol combination based decoding, which provide their outputs as inputs to a subset of nodes at a next stage of the multiple-symbol combination based decoding, are associated with trust symbols in the received word that have a higher reliability of being successfully decoded than doubt symbols in the received word. The multiple-symbol combination based decoding also involves performing a hard decision in response to determining that all of the nodes at the intermediate stage, which provide their outputs as inputs to the subset of nodes at the next stage of the multiple-symbol combination based decoding, are associated with trust symbols.

Any one or more of the following could be provided, alone or in any of various combinations, in embodiments:
  the multiple-symbol combination based decoding comprises List decoding;
  at least one of the information symbols in the input vector comprises a non-binary symbol;
  the input vector comprises at least one frozen symbol;
  the received word comprises a plurality of information symbol positions;
  the method further comprises determining which of the information symbol positions in the received word are trust symbol positions and doubt symbol positions;
  determining whether all nodes at an intermediate stage, which provide their outputs as inputs to a subset of nodes at a next stage of the multiple-symbol combination based decoding, are associated with trust symbols is based on the determined trust symbol positions;

receiving information indicative of a number of the information symbol positions in the received word that are trust symbol positions;

determining which of the information symbol positions in the received word are trust symbol positions and doubt symbol positions is based on the received information;

determining which of the symbol positions in the received word are trust symbol positions and doubt symbol positions is based on one or more of: a decoding complexity and an error performance.

The embodiments described with reference to FIG. 11 relate to an example method. Apparatus embodiments, for both encoding and decoding, are also contemplated.

Figure 12:
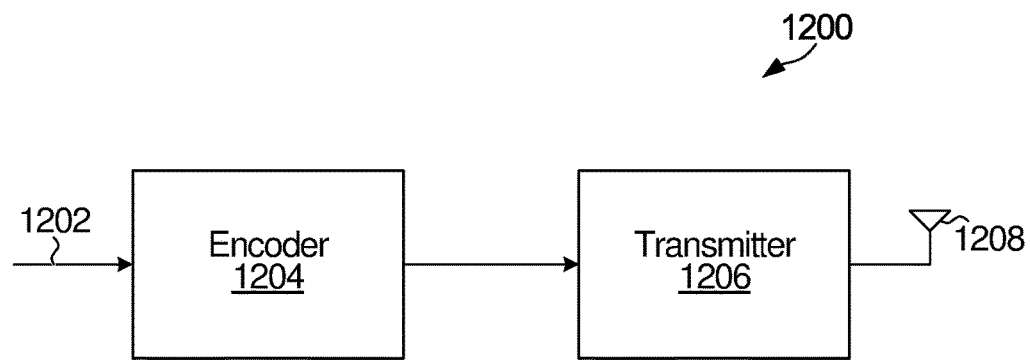
FIG. 12 is a block diagram of an example apparatus for encoding and transmitting codewords.

FIG. 12 is a block diagram of an example apparatus 1200 for encoding and transmitting codewords. The example apparatus 1200 includes an encoder 1204 coupled to a transmitter 1206. In the illustrated embodiment, the apparatus 1200 also includes an antenna 1208, coupled to the transmitter 1206, for transmitting signals over a wireless channel. In some embodiments, the transmitter 1206 includes a modulator, amplifier, and/or other components of a radio frequency (RF) transmit chain. The encoder 1204 receives input 1202 comprising symbols and is configured to implement a method described herein to encode the symbols into a codeword, which is provided to the transmitter 1206 for transmission via the antenna 1208.

The encoder 1204 is implemented in circuitry, such as a processor, that is configured to encode input bits as disclosed herein. In a processor-based implementation of the encoder 1204, processor-executable instructions to configure a processor to perform encoding operations are stored in a non-transitory processor-readable medium. The non-transitory medium could include one or more solid-state memory devices and/or memory devices with movable and possibly removable storage media.

In some alternative embodiments, the encoder 1204 and the transmitter 1206 may be fully or partially implemented in software or modules, for example in encoding, and transmitting, modules stored in a memory and executed by a processor(s) of the apparatus 1200.

In an embodiment, an apparatus is implemented using a processor configured to perform encoding, and a transmitter 1106 coupled to the processor, for transmitting codewords generated by the encoding.

Figure 13:
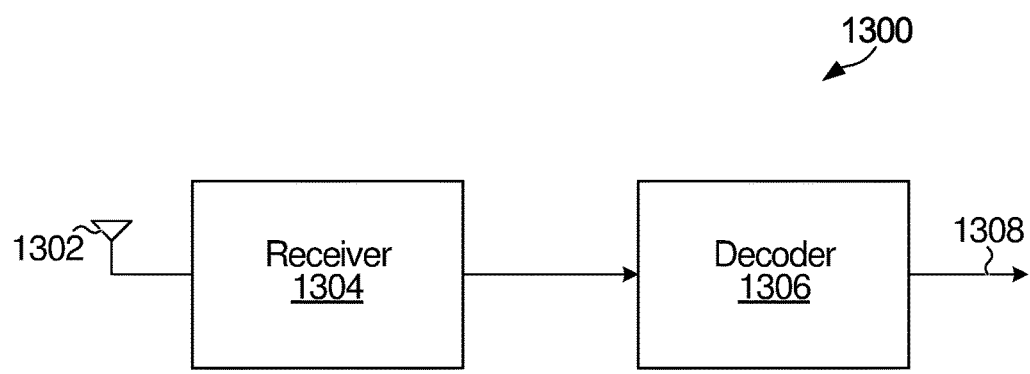
FIG. 13 is a block diagram of an apparatus for receiving and decoding codewords.

FIG. 13 is a block diagram of illustration of an apparatus 1300 for receiving and decoding codewords. The example apparatus 1300 comprises a receiver 1304 coupled to a decoder 1306. In the illustrated embodiment, the receiver 1304 has an antenna 1302 for receiving signals from a wireless channel. In some embodiments, the receiver 1304 includes a demodulator, amplifier, and/or other components of a radio frequency (RF) receive chain. The receiver 1304 receives via the antenna 1302 a signal carrying a received word that is based on a codeword. The received word is provided to the decoder 1306. The decoder 1306 is configured to implement a method described herein to decode the received word into an output that includes symbols and is provided as output 1308 from the decoder.

In some embodiments, the apparatus 1300, and similarly the apparatus 1200 in FIG. 12, include a non-transitory computer readable medium that includes instructions for execution by a processor to implement and/or control operation of the encoder 1204 in FIG. 12, to control operation of the decoder 1306 in FIG. 13, and/or to otherwise control the execution of methods described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which can be, for example, a compact disc read-only memory (CD-ROM), universal serial bus (USB) flash disk, or a removable hard disk.

In some alternative embodiments, the receiver 1304 and the decoder 1306 described herein may be fully or partially implemented in software or modules, for example in receiving and decoding modules stored in a memory and executed by a processor(s) of the apparatus 1300.

In an embodiment, an apparatus is implemented using a receiver for receiving a word that is based on a codeword. The codeword is a codeword that was generated based on a generator matrix for a polar code and an input vector that includes information symbols. A processor could be coupled to the receiver and configured to apply multiple-symbol combination based decoding to the received word. The multiple-symbol combination based decoding involves determining whether all nodes at an intermediate stage of the multiple-symbol combination based decoding, which provide their outputs as inputs to a subset of nodes at a next stage of the multiple-symbol combination based decoding, are associated with trust symbols in the received word that have a higher reliability of being successfully decoded than doubt symbols in the received word. The multiple-symbol combination based decoding also involves performing a hard decision in response to determining that all of the nodes at the intermediate stage, which provide their outputs as inputs to the subset of nodes at the next stage of the multiple-symbol combination based decoding, are associated with trust symbols.

Any one or more of the following could be provided, alone or in any of various combinations, in embodiments:
the multiple-symbol combination based decoding comprises List decoding;
at least one of the information symbols in the input vector comprises a non-binary symbol;
the input vector comprises at least one frozen symbol;
the received word comprises a plurality of information symbol positions;
the processor is further configured to determine which of the information symbol positions in the received word are trust symbol positions and doubt symbol positions;
the processor is further configured to determine whether all nodes at an intermediate stage, which provide their outputs as inputs to a subset of nodes at a next stage of the multiple-symbol combination based decoding, are associated with trust symbols based on the determined trust symbol positions;
the processor is further configured to receive information indicative of a number of the information symbol positions in the received word that are trust symbol positions;
the processor is configured to determine which of the information symbol positions in the received word are trust symbol positions and doubt symbol positions based on the received information;
the processor is configured to determine which of the symbol positions in the received word are trust symbol positions and doubt symbol positions based on one or more of: a decoding complexity and an error performance.

Figure 14:
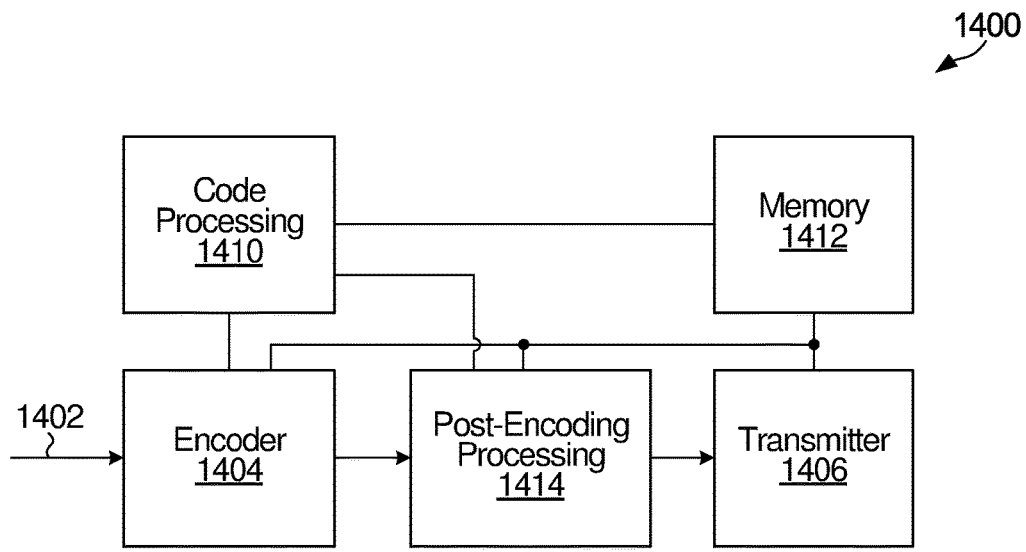
FIG. 14 is a block diagram of another example apparatus for encoding and transmitting codewords.

FIG. 14 is a block diagram of an apparatus for encoding and transmitting codewords. The apparatus 1400 includes an encoder module 1404 coupled to a transmitter module 1406. The apparatus 1400 also includes a code processing module 1410 coupled to the encoder module 1404 and a post-encoding processing module 1414. The post-encoding processing module 1414 is also coupled to the encoder module 1404 and to the transmitter module 1406. A memory 1412, also shown in FIG. 14, is coupled to the encoder module 1404, to the code processing module 1410, to the post-encoding processing module 1414, and to the transmitter module 1406. Although not shown, the transmitter module 1406 could include a modulator, an amplifier, antenna and/or other modules or components of a transmit chain or alternatively could be configured to interface with a separate (Radio-Frequency—RF) transmission module. For example, some or all of the modules 1404, 1406, 1410, 1412, 1414 of the apparatus 1400 may be implemented in hardware or circuitry (e.g. in one or more chipsets, microprocessors, application-specific integrated circuits (ASIC), field-programmable gate arrays (FPGAs), dedicated logic circuitry, or combinations thereof) so as to produce codewords as described herein for transmission by a separate (RF) unit.

In some embodiments, the memory 1412 is a non-transitory computer readable medium at 1412, that includes instructions for execution by a processor to implement and/or control operation of the code processing module 1410, the encoder module 1404, the post-encoding processing module 1414, the transmitter module 1406 in FIG. 14, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk, at 1412.

In some embodiments, the encoder module 1404 is implemented in circuitry, such as a processor, that is configured to encode input bits or symbols as disclosed herein, and/or as described by way of example above with reference to FIG. 12, for example. In a processor-based implementation of the encoder module 1404, processor-executable instructions to configure a processor to perform encoding operations are stored in a non-transitory processor-readable medium. The non-transitory medium could include, in the memory 1412 for example, one or more solid-state memory devices and/or memory devices with movable and possibly removable storage media.

The code processing module 1410 could be implemented in circuitry that is configured to determine coding parameters such as mother code block length, and to determine an ordered sub-channel sequence as disclosed herein. In some embodiments, the code processing module 1410 is implemented using a processor. The same processor or other circuitry, or separate processors or circuitry, could be used to implement both the encoder module 1404 and the code processing module 1410. As noted above for the encoder module 1404, in a processor-based implementation of the code processing module 1410, processor-executable instructions to configure a processor to perform code processing operations are stored in a non-transitory processor-readable medium, in the memory 1412 for example.

Like the encoder module 1404 and the code processing module 1410, the post-encoding processing module 1414 is implemented in circuitry, such as a processor, that is configured to perform various post-encoding operations. These post-encoding operations could include rate-matching operations such as puncturing, shortening and/or interleaving, for example. In a processor-based implementation of the post-encoding processing module 1414, processor-executable instructions to configure a processor to perform post-encoding operations are stored in a non-transitory processor-readable medium, examples of which are described above. In an embodiment, the post-encoding processing module 1414 derives a puncturing or shortening scheme from a puncturing or shortening scheme that is to be applied to a codeword prior to transmission. Information indicative of bit positions and/or sub-channels that are affected by post-encoding operations, or information from which such bit positions or sub-channels may be determined, may be fed back to the code processing module 1410, stored to the memory 1412, or otherwise made available to the code processing module 1410 by the post-encoding processing module 1414.

The apparatus 1400 could implement any of various other features that are disclosed herein. For example, the encoder module 1404, the transmitter module 1406, the code processing module 1410, and/or the post-encoding processing module 1414 could be configured to implement any one or more of the encoding/transmitting side features listed or otherwise described herein, or any one or more of encoding/transmitting side features corresponding to decoding/receiving side features listed or otherwise described herein.

In some alternative embodiments, the functionality of the encoder module 1404, the transmitter module 1406, the code processing module 1410, and/or the post-encoding processing module 1414 described herein may be fully or partially implemented in hardware or alternatively in software, for example in modules stored in a memory such as 1412 and executed by one or more processors of the apparatus 1400.

An apparatus could therefore include a processor, and a memory such as 1412, coupled to the processor, storing instructions which, when executed by the processor, cause the processor to perform the functionality and/or embodiments described above in relation to the encoder module 1404, the transmitter module 1406, the code processing module 1410, and/or the post-encoding module 1414 described herein.

Figure 15:
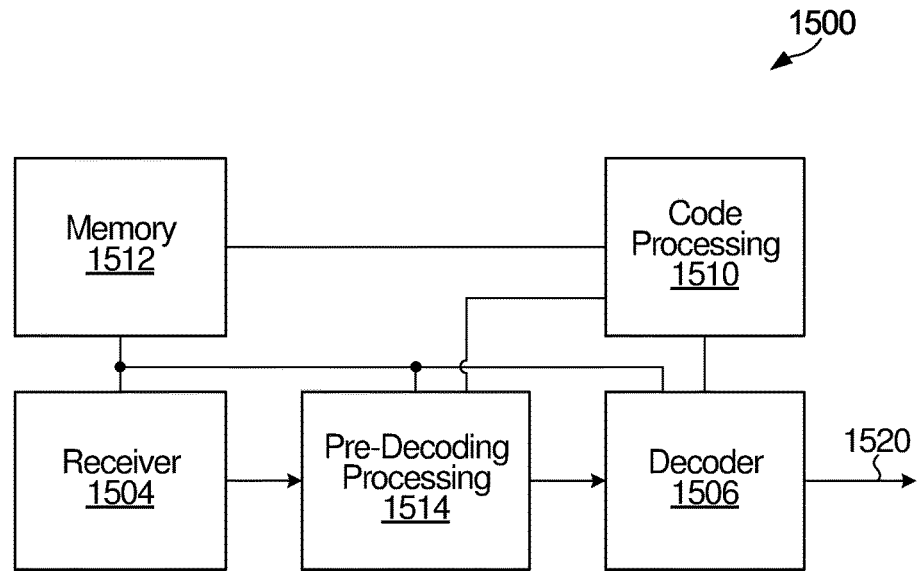
FIG. 15 is a block diagram of an example apparatus for receiving and decoding codewords.

FIG. 15 is a block diagram of an example apparatus for receiving and decoding codewords. The apparatus 1500 includes a receiver module 1504 which is configured to receive signals transmitted wirelessly and which is coupled to a decoder module 1506. The apparatus 1500 also includes a code processing module 1510 coupled to the decoder module 1506 and a pre-decoding processing module 1514. The pre-decoding processing module 1514 is also coupled to the decoder module 1506 and to the receiver module 1504. A memory 1512 also shown in FIG. 15, is coupled to the decoder module 1506, to the code processing module 1510, to the receiver module 1504, and to the pre-decoding processing module 1514.

Although not shown, the receiver module 1504 could include an antenna, demodulator, amplifier, and/or other modules or components of a receive chain or alternatively could be configured to interface with a separate (Radio-Frequency—RF) receiving module. For example, some or all of the modules 1504, 1506, 1510, 1512, 1514 of the apparatus 1500 may be implemented in hardware or circuitry (e.g. in one or more chipsets, microprocessors, ASICs, FPGAs, dedicated logic circuitry, or combinations thereof) so as to receive a word based on a codeword of a polar code as described herein. Decoded bits are output at 1520 for further receiver processing.

In some embodiments, the memory 1512 is a non-transitory computer readable medium that includes instructions for execution by a processor to implement and/or control operation of the receiver module 1504, decoder module 1506, the code processing module 1510, and the pre-decoding processing module 1514 in FIG. 15, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, USB flash disk, or a removable hard disk, at 1512.

The decoder module 1506 is implemented in circuitry, such as a processor, that is configured to decode received codewords as disclosed herein, and/or as described by way of example above with reference to FIG. 13, for example. In a processor-based implementation of the decoder module 1506, processor-executable instructions to configure a processor to perform decoding operations are stored in a non-transitory processor-readable medium. The non-transitory medium could include, in the memory 1512 for example, one or more solid-state memory devices and/or memory devices with movable and possibly removable storage media.

The code processing module 1510 is implemented in circuitry that is configured to determine (and store to the memory 1512) ordered sub-channel sequences as disclosed herein. In a processor-based implementation of the code-processing module 1510, processor-executable instructions to configure a processor to perform code-processing operations are stored in a non-transitory processor-readable medium, examples of which are described above. Information representing ordered sub-channel sequences, and/or the selected sub-channels could be provided to the decoder module 1506 by the code processing module 1510 for use in decoding received words, and/or stored in the memory 1512 by the code processing module 1510 for subsequent use by the decoder module 1506.

Like the decoder module 1506 and the code processing module 1510, the pre-decoding processing module 1514 is implemented in circuitry, such as a processor, that is configured to perform pre-decoding operations. These operations could include receiver/decoder-side rate matching operations also known as de-rate-matching operations, such as de-puncturing and/or de-shortening to reverse puncturing/shortening that was applied at an encoder/transmitter side, for example. In a processor-based implementation of the pre-decoding processing module 1514, processor-executable instructions to configure a processor to perform pre-decoding processing operations are stored in a non-transitory processor-readable medium, examples of which are described above. In an embodiment, the pre-decoding processing module 1514 derives a puncturing or shortening scheme from a puncturing or shortening scheme that is to be applied to a received codeword. Information indicative of bit positions and/or sub-channels that are affected by pre-decoding processing, or information from which such bit positions or sub-channels may be determined, may be fed back to the code processing module 1510, stored to the memory 1512, or otherwise made available to the code processing module 1510 by the pre-decoding processing module 1514.

In some alternative embodiments, the functionality of the receiver module 1504, the decoder module 1506, the code processing module 1510, and/or the pre-decoding processing module 1514 described herein may be fully or partially implemented in software or modules, for example in receiving and decoding modules stored in a memory 1512 and executed by one or more processors of the apparatus 1500.

An apparatus could therefore include a processor, and a memory such as 1512, coupled to the processor, storing instructions which, when executed by the processor, cause the processor to perform the functionality and/or embodiments disclosed herein, or receiving/decoding operations corresponding to transmitting/encoding operations disclosed herein.

The apparatus 1500 could implement any of various other features that are disclosed herein. For example, the decoder module 1506, the receiver module 1504, the code processing module 1510, and/or the pre-decoding processing module 1514 could be configured to implement any one or more of receiving/decoding features described herein, or receiving/decoding operations corresponding to transmitting/encoding operations disclosed herein.

Communication equipment could include the apparatus 1200, the apparatus 1300, the apparatus 1400, the apparatus 1500, or both a transmitter and a receiver and both an encoder and a decoder. Such communication equipment could be user equipment or communication network equipment.

Figure 16:
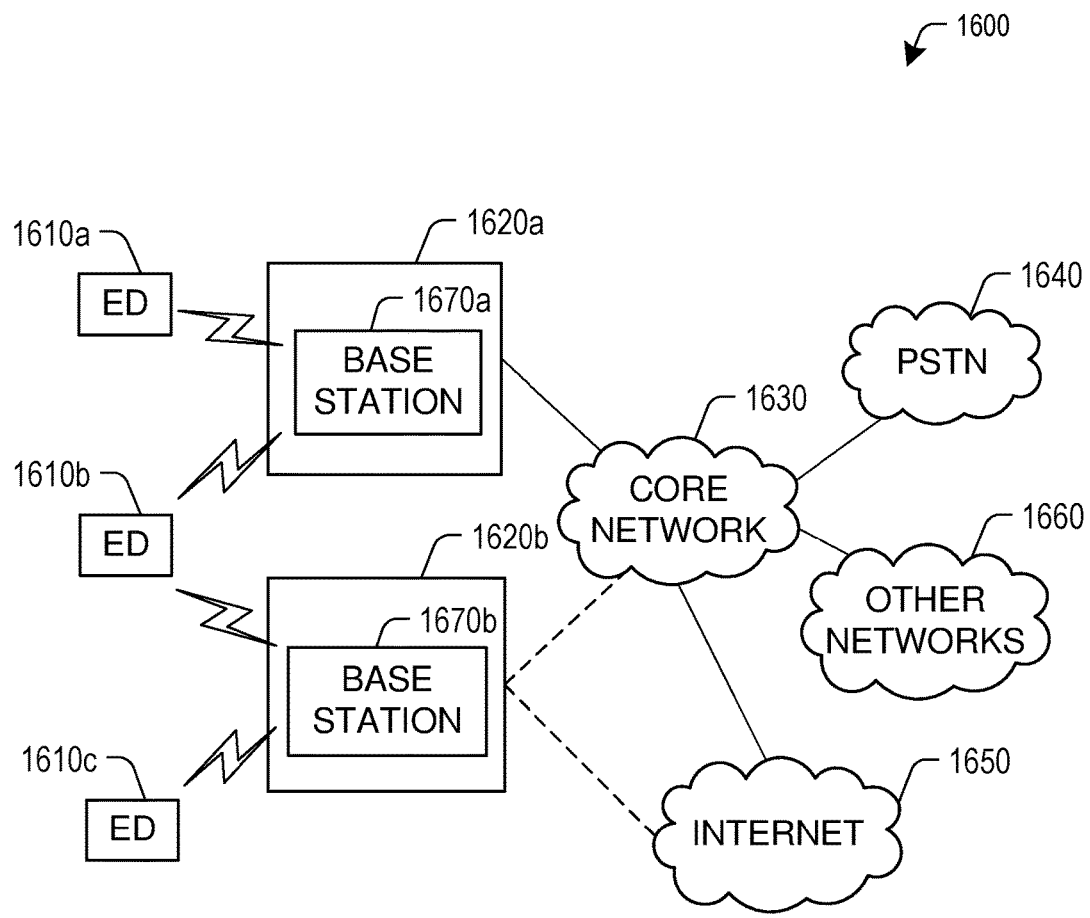
FIG. 16 is a block diagram of an example communication system in which embodiments disclosed herein may be used.

FIGS. 12 to 15 are generalized block diagrams of apparatus that could be used to implement coding as disclosed herein. FIG. 16 illustrates an example communication system 1600 in which embodiments of the present disclosure could be implemented. In general, the communication system 1600 enables multiple wireless or wired elements to communicate data and other content. The purpose of the communication system 1600 may be to provide content (voice, data, video, text) via broadcast, narrowcast, user device to user device, etc. The communication system 1600 may operate by sharing resources such as bandwidth.

In this example, the communication system 1600 includes electronic devices (ED) 1610a-1610c, radio access networks (RANs) 1620a-1620b, a core network 1630, a public switched telephone network (PSTN) 1640, the internet 1650, and other networks 1660. Although certain numbers of these components or elements are shown in FIG. 16, any reasonable number of these components or elements may be included.

The EDs 1610a-1610c and base stations 1670a-1670b are examples of communication equipment that can be configured to implement some or all of the functionality and/or embodiments described herein. For example, any one of the EDs 1610a-1610c and base stations 1670a-1670b could be configured to implement the encoding or decoding functionality (or both) described herein. In another example, any one of the EDs 1610*a*-1610*c* and base stations 1670*a*-1670*b* could include the apparatus 1200, the apparatus 1300, the apparatus 1400, and/or the apparatus 1500 described above in relation to FIGS. 12 to 15.

The EDs 1610*a*-1610*c* are configured to operate, communicate, or both, in the communication system 1600. For example, the EDs 1610*a*-1610*c* are configured to transmit, receive, or both via wireless or wired communication channels. Each ED 1610*a*-1610*c* represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication (MTC) device, personal digital assistant (PDA), smartphone, laptop, computer, tablet, wireless sensor, or consumer electronics device.

In FIG. 16, the RANs 1620*a*-1620*b* include base stations 1670*a*-1670*b*, respectively. Each base station 1670*a*-1670*b* is configured to wirelessly interface with one or more of the EDs 1610*a*-1610*c* to enable access to any other base station 1670*a*-1670*b*, the core network 1630, the PSTN 1640, the Internet 1650, and/or the other networks 1660. For example, the base stations 1670*a*-1670*b* may include (or be) one or more of several well-known devices, such as a base transceiver station (BTS), a Node-B (NodeB), an evolved NodeB (eNodeB), a Home eNodeB, a gNodeB, a transmission point (TP), a site controller, an access point (AP), or a wireless router. Any ED 1610*a*-1610*c* may be alternatively or additionally configured to interface, access, or communicate with any other base station 1670*a*-1670*b*, the internet 1650, the core network 1630, the PSTN 1640, the other networks 1660, or any combination of the preceding. The communication system 1600 may include RANs, such as RAN 1620*b*, wherein the corresponding base station 1670*b* accesses the core network 1630 via the internet 1650, as shown.

The EDs 1610*a*-1610*c* and base stations 1670*a*-1670*b* are examples of communication equipment that can be configured to implement some or all of the functionality and/or embodiments described herein. In the embodiment shown in FIG. 16, the base station 1670*a* forms part of the RAN 1620*a*, which may include other base stations, base station controller(s) (BSC), radio network controller(s) (RNC), relay nodes, elements, and/or devices. Any base station 1670*a*, 1670*b* may be a single element, as shown, or multiple elements, distributed in the corresponding RAN, or otherwise. Also, the base station 1670*b* forms part of the RAN 1620*b*, which may include other base stations, elements, and/or devices. Each base station 1670*a*-1670*b* transmits and/or receives wireless signals within a particular geographic region or area, sometimes referred to as a "cell" or "coverage area". A cell may be further divided into cell sectors, and a base station 1670*a*-1670*b* may, for example, employ multiple transceivers to provide service to multiple sectors. In some embodiments, there may be established pico or femto cells where the radio access technology supports such. In some embodiments, multiple transceivers could be used for each cell, for example using multiple-input multiple-output (MIMO) technology. The number of RAN 1620*a*-1620*b* shown is exemplary only. Any number of RAN may be contemplated when devising the communication system 1600.

The base stations 1670*a*-1670*b* communicate with one or more of the EDs 1610*a*-1610*c* over one or more air interfaces 1690 using wireless communication links e.g. radio frequency (RF), microwave, infrared (IR), etc. The air interfaces 1690 may utilize any suitable radio access technology. For example, the communication system 1600 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 1690.

A base station 1670*a*-1670*b* may implement Universal Mobile Telecommunication System (UMTS) Terrestrial Radio Access (UTRA) to establish an air interface 1690 using wideband CDMA (WCDMA). In doing so, the base station 1670*a*-1670*b* may implement protocols such as HSPA, HSPA+ optionally including HSDPA, HSUPA or both. Alternatively, a base station 1670*a*-1670*b* may establish an air interface 1690 with Evolved UTMS Terrestrial Radio Access (E-UTRA) using LTE, LTE-A, and/or LTE-B. It is contemplated that the communication system 1600 may use multiple channel access functionality, including such schemes as described above. Other radio technologies for implementing air interfaces include IEEE 802.11, 802.15, 802.16, CDMA2000, CDMA2000 1X, CDMA2000 EV-DO, IS-2000, IS-95, IS-856, GSM, EDGE, and GERAN. Of course, other multiple access schemes and wireless protocols may be utilized.

The RANs 1620*a*-1620*b* are in communication with the core network 1630 to provide the EDs 1610*a*-1610*c* with various services such as voice, data, and other services. The RANs 1620*a*-1620*b* and/or the core network 1630 may be in direct or indirect communication with one or more other RANs (not shown), which may or may not be directly served by core network 1630, and may or may not employ the same radio access technology as RAN 1620*a*, RAN 1620*b* or both. The core network 1630 may also serve as a gateway access between (i) the RANs 1620*a*-1620*b* or EDs 1610*a*-1610*c* or both, and (ii) other networks (such as the PSTN 1640, the internet 1650, and the other networks 1660). In addition, some or all of the EDs 1610*a*-1610*c* may include functionality for communicating with different wireless networks over different wireless links using different wireless technologies and/or protocols. Instead of wireless communication (or in addition thereto), the EDs 1610*a*-1610*c* may communicate via wired communication channels to a service provider or switch (not shown), and to the internet 1650. PSTN 1640 may include circuit switched telephone networks for providing plain old telephone service (POTS). Internet 1650 may include a network of computers and subnets (intranets) or both, and incorporate protocols, such as IP, TCP, UDP. EDs 1610*a*-1610*c* may be multimode devices capable of operation according to multiple radio access technologies, and incorporate multiple transceivers necessary to support such.

Figure 17A:
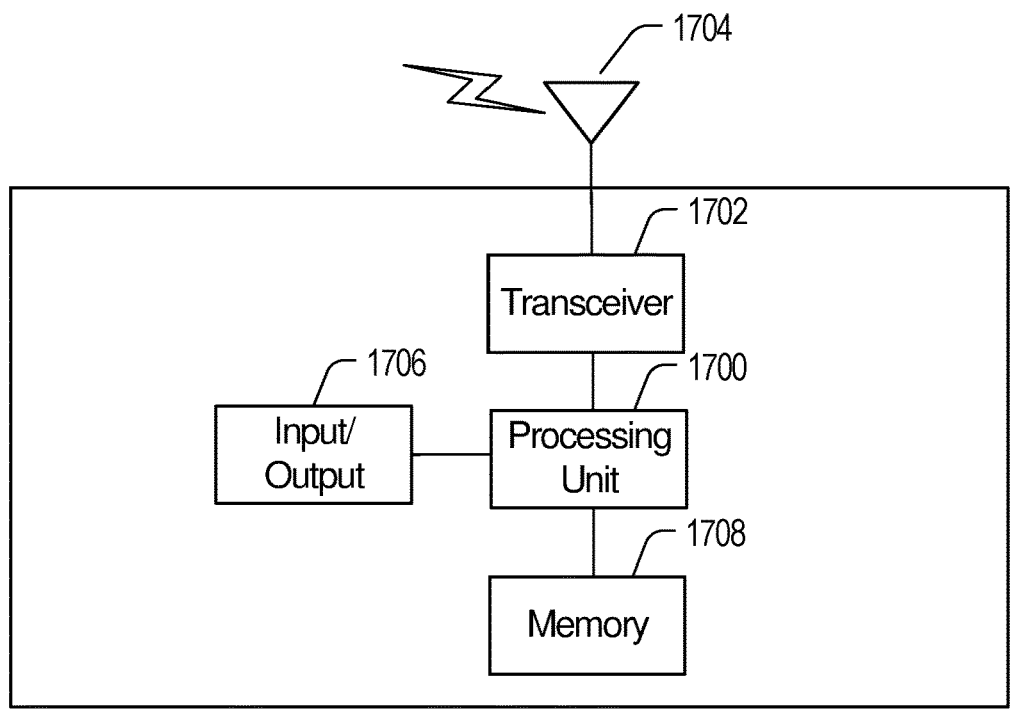
FIGS. 17A-B are block diagrams of an example Electronic Device (ED) and an example base station which may implement embodiments disclosed herein.
Figure 17B:
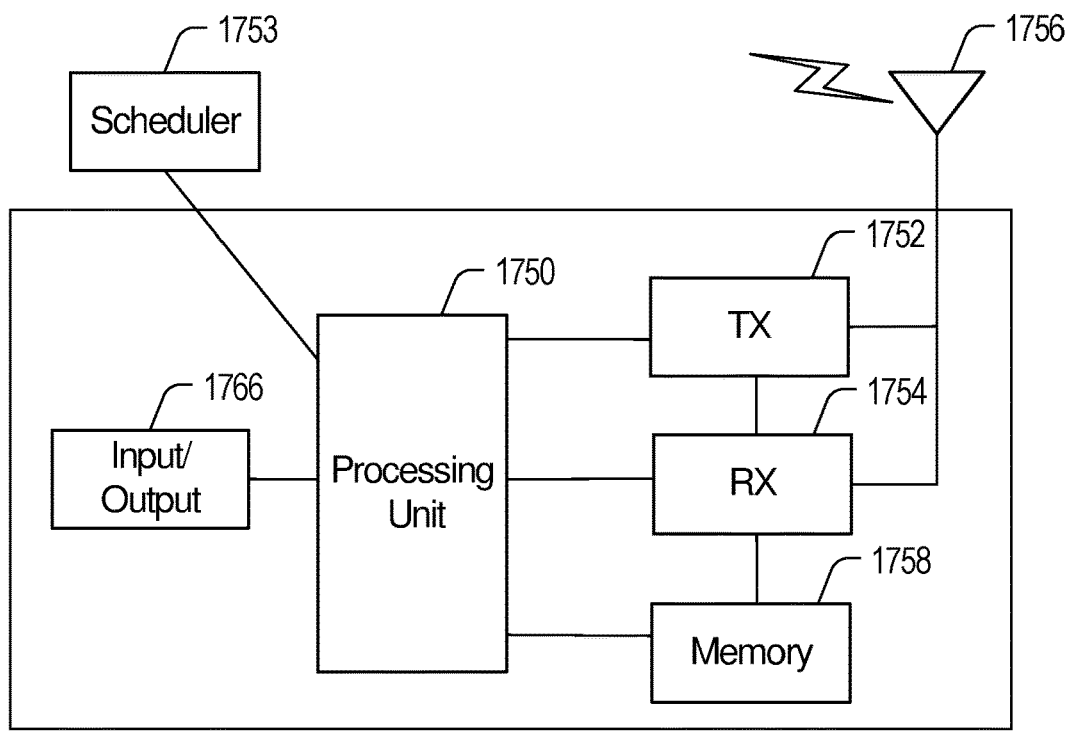

FIGS. 17A and 17B illustrate example devices that may implement the methods and teachings according to this disclosure. In particular, FIG. 17A illustrates an example ED 1610, and FIG. 17B illustrates an example base station 1670. These components could be used in the communication system 1600 or in any other suitable system.

As shown in FIG. 17A, the ED 1610 includes at least one processing unit 1700. The processing unit 1700 implements various processing operations of the ED 1610. For example, the processing unit 1700 could perform signal coding, data processing, power control, input/output processing, or any other functionality enabling the ED 1610 to operate in the communication system 1600. The processing unit 1700 may also be configured to implement some or all of the functionality and/or embodiments described in more detail above. Each processing unit 1700 includes any suitable processing or computing device configured to perform one or more operations. Each processing unit 1700 could, for example, include a microprocessor, microcontroller, digital signal processor, field programmable gate array, or application specific integrated circuit.

The ED 1610 also includes at least one transceiver 1702. The transceiver 1702 is configured to modulate data or other content for transmission by at least one antenna or Network Interface Controller (NIC) 1704. The transceiver 1702 is also configured to demodulate data or other content received by the at least one antenna 1704. Each transceiver 1702 includes any suitable structure for generating signals for wireless or wired transmission and/or processing signals received wirelessly or by wire. Each antenna 1704 includes any suitable structure for transmitting and/or receiving wireless or wired signals. One or multiple transceivers 1702 could be used in the ED 1610, and one or multiple antennas 1704 could be used in the ED 1610. Although shown as a single functional unit, a transceiver 1702 could also be implemented using at least one transmitter and at least one separate receiver.

The ED 1610 further includes one or more input/output devices 1706 or interfaces (such as a wired interface to the internet 1650). The input/output devices 1706 permit interaction with a user or other devices in the network. Each input/output device 1706 includes any suitable structure for providing information to or receiving information from a user, such as a speaker, microphone, keypad, keyboard, display, or touch screen, including network interface communications.

In addition, the ED 1610 includes at least one memory 1708. The memory 1708 stores instructions and data used, generated, or collected by the ED 1610. For example, the memory 1708 could store software instructions or modules configured to implement some or all of the functionality and/or embodiments described above and that are executed by the processing unit(s) 1700. Each memory 1708 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 17B, the base station 1670 includes at least one processing unit 1750, at least one transmitter 1752, at least one receiver 1754, one or more antennas 1756, at least one memory 1758, and one or more input/output devices or interfaces 1766. A transceiver, not shown, may be used instead of the transmitter 1752 and receiver 1754. A scheduler 1753 may be coupled to the processing unit 1750. The scheduler 1753 may be included within or operated separately from the base station 1670. The processing unit 1750 implements various processing operations of the base station 1670, such as signal coding, data processing, power control, input/output processing, or any other functionality. The processing unit 1750 can also be configured to implement some or all of the functionality and/or embodiments described in more detail above. Each processing unit 1750 includes any suitable processing or computing device configured to perform one or more operations. Each processing unit 1750 could, for example, include a microprocessor, microcontroller, digital signal processor, field programmable gate array, or application specific integrated circuit.

Each transmitter 1752 includes any suitable structure for generating signals for wireless or wired transmission to one or more EDs or other devices. Each receiver 1754 includes any suitable structure for processing signals received wirelessly or by wire from one or more EDs or other devices. Although shown as separate components, at least one transmitter 1752 and at least one receiver 1754 could be combined into a transceiver. Each antenna 1756 includes any suitable structure for transmitting and/or receiving wireless or wired signals. Although a common antenna 1756 is shown here as being coupled to both the transmitter 1752 and the receiver 1754, one or more antennas 1756 could be coupled to the transmitter(s) 1752, and one or more separate antennas 1756 could be coupled to the receiver(s) 1754. Each memory 1758 includes any suitable volatile and/or non-volatile storage and retrieval device(s) such as those described above in connection to the ED 1610. The memory 1758 stores instructions and data used, generated, or collected by the base station 1670. For example, the memory 1758 could store software instructions or modules configured to implement some or all of the functionality and/or embodiments described above and that are executed by the processing unit(s) 1750.

Each input/output device 1766 permits interaction with a user or other devices in the network. Each input/output device 1766 includes any suitable structure for providing information to or receiving/providing information from a user, including network interface communications.

The embodiments described with reference to FIGS. 12 to 17B relate to example apparatus. Method embodiments are also described earlier herein. In another embodiment, a non-transitory processor-readable medium stores instructions which, when executed by one or more processors, cause the one or more processors to perform a method as disclosed herein.

The previous description of some embodiments is provided to enable any person skilled in the art to make or use an apparatus, method, or processor readable medium according to the present disclosure. Various modifications to these embodiments will be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary and/or multi-bit symbols. If one sub-channel can transmit more than one bit, then several bits can be combined into a symbol in a defined alphabet, and a non-binary symbol is encoded for each sub-channel. Accordingly, polarization kernels are not limited to binary kernels. Symbol-level (Galois field) or non-binary kernels are also contemplated. A non-binary kernel could be preferred for its higher degree of polarization than a binary kernel. However, decoding computation complexity is higher for a non-binary kernel, because a decoder would handle symbols rather than bits.

In the present disclosure, polar codes based on an Arikan 2-by-2 kernel are described solely for illustrative purposes. Embodiments may be implemented in conjunction with polar codes that are based on different kernels, and/or other types of codes that exhibit polarization. Assistant-bit based polar codes such as those disclosed in U.S. Provisional Patent Application No. 62/442,654, entitled "Apparatus and Methods for Decoding Assistant Bit-Based Polar Code Construction", filed on Jan. 5, 2017, incorporated herein by reference, and/or other types of parity check polar codes, could also or instead be used. The techniques disclosed herein could be applied to other types of polarization kernels for example, such as non-two prime number dimension kernels, non-primary dimension kernels, and/or higher dimension kernels formed by a combination of different (primary or non-primary) dimensions of kernels.

As noted above, polar codes have been selected for uplink and downlink eMBB control channel coding for the new 5G air interface, also known as 5G new radio (NR). The techniques disclosed herein could be used not only for control data over a control channel but also or instead other types of data (e.g. user data) over any type of channel (e.g. a data channel).

We claim:

1. A method comprising:
   receiving a word that is based on a codeword, wherein the codeword was generated based on a generator matrix for a polar code and an input vector that includes information symbols;
   applying multiple-symbol combination based decoding to the received word, the multiple-symbol combination based decoding comprising:
     determining whether all nodes at an intermediate stage of the multiple-symbol combination based decoding, which provide their outputs as inputs to a subset of nodes at a next stage of the multiple-symbol combination based decoding, are associated with trust symbols in the received word that have a higher reliability of being successfully decoded than doubt symbols in the received word; and
     performing a hard decision in response to determining that all of the nodes at the intermediate stage, which provide their outputs as inputs to the subset of nodes at the next stage of the multiple-symbol combination based decoding, are associated with trust symbols.

2. The method of claim 1, wherein the multiple-symbol combination based decoding comprises List decoding.

3. The method of claim 1, wherein at least one of the information symbols in the input vector comprises a non-binary symbol.

4. The method of claim 1, wherein the input vector comprises at least one frozen symbol.

5. The method of claim 1,
   wherein the received word comprises a plurality of information symbol positions,
   wherein the method further comprises determining which of the information symbol positions in the received word are trust symbol positions and doubt symbol positions, and
   wherein determining whether all nodes at an intermediate stage, which provide their outputs as inputs to a subset of nodes at a next stage of the multiple-symbol combination based decoding, are associated with trust symbols is based on the determined trust symbol positions.

6. The method of claim 5, further comprising:
   receiving information indicative of a number of the information symbol positions in the received word that are trust symbol positions,
   wherein determining which of the information symbol positions in the received word are trust symbol positions and doubt symbol positions is based on the received information.

7. The method of claim 5, wherein determining which of the symbol positions in the received word are trust symbol positions and doubt symbol positions is based on one or more of: a decoding complexity and an error performance.

8. A non-transitory processor-readable medium storing instructions which, when executed by one or more processors, cause the one or more processors to perform a method, the method comprising:
   receiving a word that is based on a codeword, wherein the codeword was generated based on a generator matrix for a polar code and an input vector that includes information symbols;
   applying multiple-symbol combination based decoding to the received word, the multiple-symbol combination based decoding comprising:
     determining whether all nodes at an intermediate stage of the multiple-symbol combination based decoding, which provide their outputs as inputs to a subset of nodes at a next stage of the multiple-symbol combination based decoding, are associated with trust symbols in the received word that have a higher reliability of being successfully decoded than doubt symbols in the received word; and
   performing a hard decision in response to determining that all of the nodes at the intermediate stage, which provide their outputs as inputs to the subset of nodes at the next stage of the multiple-symbol combination based decoding, are associated with trust symbols.

9. An apparatus comprising:
   a receiver for receiving a word that is based on a codeword, wherein the codeword was generated based on a generator matrix for a polar code and an input vector that includes information symbols; and
   a processor, coupled to the receiver, configured to apply multiple-symbol combination based decoding to the received word, the multiple-symbol combination based decoding comprising:
     determining whether all nodes at an intermediate stage of the multiple-symbol combination based decoding, which provide their outputs as inputs to a subset of nodes at a next stage of the multiple-symbol combination based decoding, are associated with trust symbols in the received word that have a higher reliability of being successfully decoded than doubt symbols in the received word; and
     performing a hard decision in response to determining that all of the nodes at the intermediate stage, which provide their outputs as inputs to the subset of nodes at the next stage of the multiple-symbol combination based decoding are associated with trust symbols.

10. The apparatus of claim 9, wherein the multiple-symbol combination based decoding comprises List decoding.

11. The apparatus of claim 9, wherein at least one symbol in the input vector comprises a non-binary symbol.

12. The apparatus of claim 9, wherein the input vector comprises at least one frozen symbol.

13. The apparatus of claim 9,
   wherein the received word comprises a plurality of information symbol positions,
   wherein the processor is further configured to determine which of the information symbol positions in the received word are trust symbol positions and doubt symbol positions, and
   wherein the processor is configured to determine whether all nodes at an intermediate stage, which provide their outputs as inputs to a subset of nodes at a next stage of the multiple-symbol combination based decoding, are associated with trust symbols based on the determined trust symbol positions.

14. The apparatus of claim 13, wherein the processor is further configured to receive information indicative of a number of the information symbol positions in the received word that are trust symbol positions, wherein the processor is configured to determine which of the information symbol positions in the received word are trust symbol positions and doubt symbol positions based on the received information.

15. The apparatus of claim 13, wherein the processor is configured to determine which of the symbol positions in the received word are trust symbol positions and doubt symbol positions based on one or more of: a decoding complexity and an error performance.

* * * * *